US007174400B2

(12) United States Patent
Horowitz et al.

(10) Patent No.: US 7,174,400 B2
(45) Date of Patent: Feb. 6, 2007

(54) INTEGRATED CIRCUIT DEVICE THAT STORES A VALUE REPRESENTATIVE OF AN EQUALIZATION CO-EFFICIENT SETTING

(75) Inventors: Mark A. Horowitz, Menlo Park, CA (US); Richard M. Barth, Palo Alto, CA (US); Craig E. Hampel, San Jose, CA (US); Alfredo Moncayo, Redwood City, CA (US); Kevin S. Donnelly, Los Altos, CA (US); Jared L. Zerbe, Woodside, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/181,411

(22) Filed: Jul. 13, 2005

(65) Prior Publication Data

US 2005/0251602 A1 Nov. 10, 2005

Related U.S. Application Data

(63) Continuation of application No. 11/073,403, filed on Mar. 4, 2005, now Pat. No. 7,032,058, which is a continuation of application No. 10/742,247, filed on Dec. 19, 2003, now Pat. No. 7,032,057, which is a continuation of application No. 10/359,061, filed on Feb. 4, 2003, now Pat. No. 6,684,263, which is a continuation of application No. 09/910,217, filed on Jul. 19, 2001, now Pat. No. 6,516,365, which is a continuation of application No. 09/420,949, filed on Oct. 19, 1999, now Pat. No. 6,321,282.

(51) Int. Cl.
*G06F 13/00* (2006.01)

(52) U.S. Cl. .................... 710/104; 711/170; 710/8; 710/305

(58) Field of Classification Search .................... None
See application file for complete search history.

(56) References Cited

U.S. PATENT DOCUMENTS

| 6,442,644 | B1 | 8/2002 | Gustavson et al. | 711/105 |
|---|---|---|---|---|
| 6,448,813 | B2 | 9/2002 | Garlepp et al. | 326/83 |
| 6,462,588 | B2 | 10/2002 | Lau et al. | 327/108 |
| 6,516,365 | B2 | 2/2003 | Horowitz et al. | 710/104 |
| 6,643,787 | B1 * | 11/2003 | Zerbe et al. | 713/400 |
| 6,661,268 | B2 | 12/2003 | Stark et al. | 327/170 |
| 6,684,263 | B2 | 1/2004 | Horowitz et al. | 710/8 |
| 6,995,627 | B2 * | 2/2006 | Casper et al. | 333/18 |

OTHER PUBLICATIONS

Gillingham, Peter, "SLDRAM Architectural and Functional Overview", SLDRAM Consortium, pp. 1-14, Aug. 29, 1997.
Intel Corporation, "Intel 430 TX PCISET: 82439 TX System Controller (MTXC)", Feb. 1997.
Nakase et al., "Source Synchronization and Timing Vernier Techniques for 1.2-GB/s SLDRAM Interface", *IEEE J. Solid-State Circuits*, vol. 34, No. 4, Apr. 1999.
Paris et al., "WP 24.3: An 800 MB/s 72 Mb SLDRAM with Digitally-Calibrated DLL", ISSCC Slide Supplement, IEEE, 1999.
SLDRAM Inc., "400/Mb/s/pin", Jul. 9, 1998.

* cited by examiner

*Primary Examiner*—Glenn A. Auve
(74) *Attorney, Agent, or Firm*—Morgan, Lewis & Bockius LLP

(57) ABSTRACT

An integrated circuit device is described. The integrated circuit device includes a transmitter circuit having an output driver to output data, and a register to store a value representative of an equalization co-efficient setting of the output driver. The value may be determined based on information stored in a supplemental memory device.

33 Claims, 22 Drawing Sheets

INTEGRATED CIRCUIT DEVICE THAT STORES A VALUE REPRESENTATIVE OF AN EQUALIZATION CO-EFFICIENT SETTING

CROSS REFERENCE TO RELATED CASES

This application is a continuation of Ser. No. 11/073,403, filed on Mar. 4, 2005 now U.S. Pat. No. 7,032,058, which was a continuation of Ser. No. 10/742,247, filed Dec. 19, 2003 now U.S. Pat. No. 7,032,057, which is a continuation of Ser. No. 10/359,061, filed Feb. 4, 2003 now U.S. Pat. No. 6,684,263, which was a continuation of Ser. No. 09/910,217 filed Jul. 19, 2001, now U.S. Pat. No. 6,516,365, which was a continuation of Ser. No. 09/420,949 filed Oct. 19, 1999, now U.S. Pat. No. 6,321,282, the contents of all of which are herein incorporated by reference.

TECHNICAL FIELD

The present invention relates generally to a bus system, and particularly to a bus system capable of adjusting signal characteristics in response to topography dependent parameters.

BACKGROUND OF THE INVENTION

A bus system is a chip-to-chip electronic communications system in which one or more slave devices are connected to, and communicate with, a master device through shared bus signal lines. FIG. 1 illustrates in block diagram form a bus system. The bus system includes a Master control device (M) that communicates with one or more Slave devices (D) via a bi-directional data bus. Typically, the bi-directional data bus comprises a plurality of bus signal lines, but for simplicity, FIG. 1 illustrates only one bus signal line. The terms bus signal line and channel are used synonymously herein. Thus, it will be understood that the data bus includes many channels, one for each bit of data. Each bus signal line terminates on one side at an I/O pin of the master device and terminates on its other side at one end of a resistive terminator (T). The resistance of the terminator is closely matched to the loaded impedance, $Z_L$, of the bus signal line to minimize reflections and absorb signals sent down the bus signal line toward the terminator. The opposite end of the terminator is connected to a voltage supply that provides an AC ground and sets the DC termination voltage of the bus signal line. The positions along the bus signal line tapped by the Master terminator, and Slaves are labeled $p_M$, $p_T$, and $p_1$ - - - $p_N$, respectively.

Bus systems are typically designed to work with several configurations to allow system flexibility. For example, the bus may have several connector slots for inserting individual Slaves or Modules of Slaves, and each Module may have different numbers of devices. This allows the user to change the number of chips that operate in the bus system, allowing small, medium, and large systems to be configured without complex engineering changes, such as changes to the printed circuit board layout. FIG. 2 illustrates a Bus System that provides this flexibility by providing three connectors for three Slave Modules. This figure does not necessarily illustrate the physical layout of an actual system, but shows the electrical connections of the Bus System. The first Module is shown with eight Slaves, the second with four Slaves, and the third Modules with no Slaves. The third Module serves only to electrically connect the terminator to the bus signal line. For simplicity, this configuration can be referred to as an 8-4-0 configuration, and many other configurations are possible by inserting different Modules into the three connector slots (e.g. 8-8-8, 4-0-0, etc.). As in FIG. 1, FIG. 2 designates the points at which each device taps the bus signal line (e.g. Slave $B_2$ taps the bus signal line at point $p_{B2}$). The Bus System of FIG. 2 is very flexible; however, this flexibility results in configuration-dependent and position-dependent channel characteristics that lead to signaling complexities and reduce the reliability of data transmission through the system.

FIG. 3 diagrams structure and electrical properties of a bus signal line in a populated Module of the Bus System of FIG. 2. The portion of the bus signal line that connects to the Slaves forms a repetitive structure of signal line segments and Slaves that can be modeled as a transmission line of length d, with electrical characteristics as shown. In FIG. 3 $L_o$ is the inductance per unit length, $C_o$ is the capacitance per unit length, $G_p$ is the dielectric conductance per unit length, and $R_s$ is the conductor resistance per unit length. The lossy, complex characteristic impedance of such transmission line is given by:

$$Z_{0L} = \sqrt{\frac{R_S + jwL_0}{G_P + jwC_I}}$$

However, assuming $R_s$ and $G_p$ are small, the characteristic impedance of the bus signal line segment is closely approximated by the simpler equation $Z=(L_0/C_0)^{1/2}$.

FIG. 3 also shows the dominant electrical properties of the Slaves I/O pins where $L_I$ is the effective input inductance, $C_I$ is the effective input capacitance, and $R_I$ is the effective input resistance. This input resistance incorporates all input losses including metallic, ohmic, and on-chip substrate losses; is frequency dependent; and tends to increase with frequency. However, assuming that the input capacitance dominates the input electrical characteristics of the Slave (i.e. $Xc=1/(2\pi fC_I)?>X_L=2\pi fL_I$ and $Xc=1/(2\pi fC_I)?>R_I$) at the system operating frequency, the effective loaded impedance of the bus signal lines is closely approximated by:

$$Z_L = \sqrt{\frac{L_o \cdot d}{(C_o \cdot d) + C_I}}$$

This equation implies that the lumped capacitance of the Slaves' I/O pins is distributed into the effective impedance of the transmission lines. However, the repetitive arrangement of Slaves at intervals of length d along the bus signal line causes the bus signal line to possess a multi-pole low-pass filter characteristic. This low-pass characteristic essentially limits the maximum data transfer rate of the bus system. The cut-off frequency of the channel increases as the number of devices on the channel decreases; as the device spacing, d, decreases; and as the input capacitance, $C_I$, decreases. FIGS. 4, 5 and 6, illustrate these effects. Additionally, dissipative sources of loss such as the dielectric of the bus' printed circuit board substrate, the skin effect resistance of the bus' metal traces, and the slave devices' input resistances, $R_I$, also contribute to the low-pass characteristic of the bus signal line, further reducing the usable bandwidth. FIG. 7 illustrates this. For any number of Slaves, it is clearly desirable to have minimum device pitch, d; minimum input capacitance, $C_I$; and minimum loss (e.g. $R_I$) for maximum frequency operation of the system.

For these reasons, the device pitch, d, is generally kept at a fixed, minimum practical length which is determined by space limitations and printed circuit board technology. Likewise input capacitance is kept to a fairly tight, minimum range determined by silicon ESD requirements and processing limitations. Losses are also typically controlled within a specified range. Therefore, although there is some variation in these three factors, the major determinant of the channel's response and bandwidth is the configuration and number of devices. This is illustrated in FIG. 8. FIG. 8 illustrates the channel response from the Master to the last Slave device on the channel (i.e., the forward transmission to device $D_N$) for three system configurations, 16-8-8, 8-4-0, and 4-0-0. The solid line for each configuration plots the typical response while the shading around each line indicates the range of likely channel responses for that configuration considering manufacturing variations in device pitch, input capacitance, and loss (both $R_T$ and channel losses). FIG. 8 suggests that the channel characteristics are largely determined by the system configuration, such that transmission of data through Bus System (to the last device) depends strongly on the configuration used (i.e. number and type of modules used). Thus, it may be possible to improve the performance of the Bus System by adjusting transmitter or receiver parameters in response to the particular system configuration that is being used in order to compensate for the configuration-dependent transmission characteristics.

FIG. 9 illustrates the channel response between the Master and the first, middle, and last Slaves in an N-device Bus System. The solid lines in FIG. 9 plot the typical response for the first, middle, and Nth device while the shading around each line indicates the range of likely channel responses for that device position considering manufacturing variations in device pitch, input capacitance, and loss. FIG. 9 suggests that for a given channel configuration, the channel characteristics between the Master and any individual slave is largely determined by the position of the slave device within the Bus System configuration. Thus, the Bus System performance may be improved between the Master and each individual Slave by adjusting certain transmitter or receiver parameters according to which Slave is being addressed, thus compensating for the position-dependent channel characteristics.

FIG. 10 illustrates the channel response between the Master and the Slave on each of three modules of a three-module Bus System. The solid lines of FIG. 10 plot the typical response of the middle device in each of the three modules while the shading around the line for Module B indicates the range of channel responses for Slaves on that module. This range of channel responses takes into account manufacturing variations in device pitch, input capacitance, and loss as well as the range of physical positions within the module. The range of channel responses on Module A may overlap the range of channel responses for Module B, and similarly the range of channel responses on Module C may overlaps that of Module B. FIG. 10 suggests that for a given channel configuration, the channel characteristics between the Master and any individual Slave is largely determined by the Module on which the Slave is located. Thus, it may be possible to improve the performance of the Bus System by adjusting certain transmitter or receiver parameters according to which Module is being addressed to compensate for the Module position-dependent channel characteristics.

FIGS. 8–10 demonstrate that although Bus Systems with the same configuration have individual differences, electrical characteristics can generally be associated with each configuration, Module, or Slave position. For example, a 4-4-0 Bus System generally has less attenuation than a 4-8-0 Bus System, therefore, signaling between the Master and any Slave depends on the individual device characteristics, its position in the Bus System, and the configuration of the Bus System.

FIG. 11 illustrates the effect of position-dependent channel characteristics on binary signaling between the master device and various slave devices in a system. FIG. 11A shows what a . . . 101010 . . . binary data pattern might look like when it is transmitted at the Master. The signal at the Master has a fairly large amplitude given by the equation $V_{Swing,M} = (V_{OH,M} - V_{OL,M}) = (V_{Term} - V_{OL,M}) = (V_L + V_H)_{,M}$ and has sharp rise and fall times indicated in FIG. 11A as $t_r$ and $t_f$, respectively. Additionally, the transmitted signal is asymmetric relative to the reference voltage, $V_{ref}$. The amount of asymmetry is measured by the equation:

$$Asym = \frac{V_L - V_H}{V_L + V_H}$$

As the signal propagates down the channel, its shape is altered by the channel's response. For a low pass channel as shown in FIGS. 4–10, both the signal's amplitude and edge rate will decrease as it propagates down the channel. For example, FIG. 11B illustrates what the signal of FIG. 11A might look like by the time it reaches the middle Slave, and FIG. 11C shows what it may look like by the time it reaches the end of the channel. The decreased amplitude lowers the Bus System's voltage margin whereas the slower edge rates decreases the timing margin. FIGS. 11A–11C also illustrate how voltage asymmetry varies based upon the position of the receiving device with respect to the master.

Referring now to FIG. 12A, configuration dependent channel characteristics may give rise to an undesired timing skew between clock and data signals as they propagate from the transmitting device (which may be the Master or a Slave) to the receiving device (which may be a Slave or the Master). Ideally, data signals should be detected by the receiving device at a time t1 during the data eye. As used herein, "data eye" refers to the period, denoted "tbit," during which valid data is on the bus between data transition periods. Time $t_1$ corresponds to the center of the data eye and it provides maximum timing margin, ½ tbit, for data detection between data transition periods. When the clock transition occurs in the center of the data eye, "timing center" is said to exist. FIG. 12A illustrates this ideal relationship between the data signal and the receiving device's receive clock signal. A data signal transmitted so that it aligns ideally with respect to a receiving device's receive clock signal may arrive at the receiving device early or late with respect to the receiving device's receive clock signal. In some embodiments, the best data receive time may be at another point within the data eye, other than the center, due to known or predicted characteristics of the data channel.

It is well known that channel characteristics introduce undesired timing skew between the receive clock signal and data signals at the time of detection that varies as a function of the position of the receiving device with respect to the transmitting device and the direction of signal transmission. For example, channel characteristics may cause the Master to read data from Slaves too early in the data eye and may cause the Master to write data to the Slaves too late in the data eye. How early or late the Master reads or writes depends upon the system configuration and the location of each Slave relative the master. FIG. 12B is a timing diagram illustrating the master's receive clock signal transition occurring early in the data eye by an error period of δ. FIG. 12C is a timing diagram illustrating the Master's transmit clock transition occurring late in the data eye by an error period of δ.

Corruption of data transmitted via the Bus results not only from static characteristics, but also from data dependent phenomenon such as residual and cross-coupled signals. Residual signals on the Bus result from past transmissions on the same channel and tend to cause voltage margins on the channel to vary from one sampling interval to the next. Cross-coupled signals result from inductive coupling of signals on neighboring channels, rather than from past signals on the same channel. Cross-coupled signals also tend to cause voltage margins on the channel to vary from one sampling interval to the next. Herein voltage margin variations caused by residual signals are referred to as temporal variations while margin variations caused by cross-coupled signals are referred to as cross-coupling variations.

FIG. 25 illustrates a bit-stream of 0, 1, 1, 0, transmitted on the Bus, which exhibits the voltage margin variation that can result from residual signals. The voltage on the channel rises to $V_{HI}$ during transmission of the first logical 0. As, the voltage on the channel does not reach $V_{LO}$ during transmission of the first logical 1, instead reaching a local minimum 200 mV above $V_{LO}$. By contrast, the voltage on the channel drops 100 mV below $V_{LO}$ during transmission of the final logical 1. Finally, the voltage on the channel reaches a local maximum 200 mV below $V_{HI}$ during transmission of the final logical 0. FIG. 25 thus illustrates how an output signal on a channel is affected by prior transmissions on the same channel. In general, a logical 1 that follows a logical 0 is less likely to reach $V_{LO}$ than a logical 1 that follows transmission of another logical 1. Similarly, a logical 0 that follows a logical 1 is less likely to reach $V_{HI}$ than a logical 0 that follows transmission of another logical 0. Both of these effects result in reduced voltage margins at the receiver, making the Bus System more susceptible to bit errors caused by noise and other margin-reducing effects.

To offset some of the channel's corrupting effects on data signals, prior art systems have used a combination of adjustable parameters; e.g. these parameters include: edge or slew rate control and current or swing control. These parameters are typically set to improve communication with the last Slave on the channel, and the parameters are then held constant no matter which Slave is accessed. This technique often does improve the performance of the Bus System. For example, adjusting the current control such that the last Slave on the channel received a balanced, full swing signal certainly improves communication between the Master and the last Slave. Communication between these two devices might otherwise be unreliable. However, adjusting the swing such that the last Slave is improved can corrupt communication between the Master and the first few Slaves on the channel. For example, reflections of this large, asymmetric signal at channel discontinuities near the first few Slaves can severely degrade the voltage margin of the first few Slaves, particularly the $V_H$ voltage margin. Secondly, the large asymmetry at the first few Slaves causes duty cycle error since $V_{REF}$ is not at the center of the data waveform. This degrades the timing margin at the first few devices. Therefore, a need exists for a Bus System that adjusts its transmitter, channel, and/or receiver parameters to improve communication between the Master and any Slave on the channel.

SUMMARY OF THE INVENTION

The apparatus of the present invention improves bus communications by adjusting signal characteristics in response to topography dependent parameters. In a first embodiment as a bus transmitter, the apparatus of the present invention adjusts a transmit signal characteristic in response to a topography dependent parameter. The bus transmitter of the present invention includes a port, a register, parameter adjustment circuitry, and an output driver. The port receives a topography dependent parameter, which will be used to adjust a transmit signal characteristic. Coupled to the port, the register stores the topography dependent parameter for later use by the parameter adjustment circuitry. The parameter adjustment circuitry responds to the topography dependent parameter by adjusting a parameter control signal, which is coupled to the output driver. Prior to driving an output signal onto a bus, the output driver adjusts the transmit signal characteristic in response to the parameter control signal.

In a second embodiment as a bus receiver, the apparatus of the present invention adjusts a receive signal characteristic in response to topography dependent parameter. The bus receiver of the present invention includes a port, a register, parameter adjustment circuitry, and an input buffer. The port receives the topography dependent parameter and stores it in the register. The register couples the topography dependent parameter to the parameter adjustment circuitry, which responds to it by adjusting a receiver characteristic. The input buffer receives an input signal from a bus coupling the receiver to a transmitter of the input signal. The input buffer generates a first signal from the input signal by adjusting the receive parameter of the input signal in accordance with the adjusted receiver characteristic.

BRIEF DESCRIPTION OF THE DRAWINGS

Additional features of the invention will be more readily apparent from the following detailed description and appended claims when taken in conjunction with the drawings, in which:

DETAILED DESCRIPTION

Figure 1:
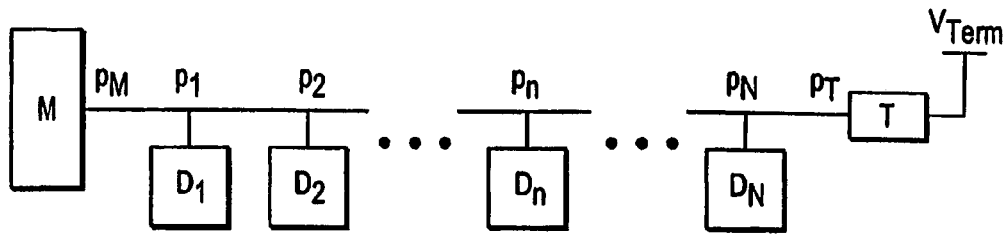
FIG. 1 illustrates a prior Bus System.
Figure 2:
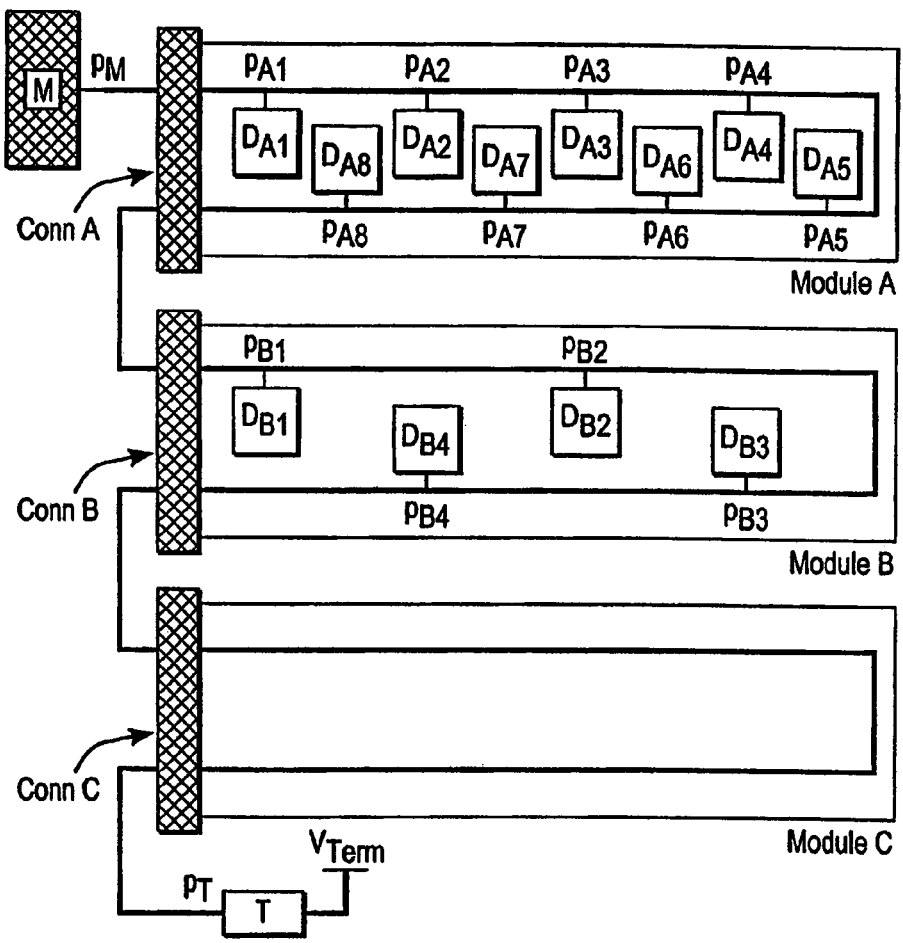
FIG. 2 illustrates a prior Bus System that includes multiple connectors for Modules of Slaves.
Figure 3:
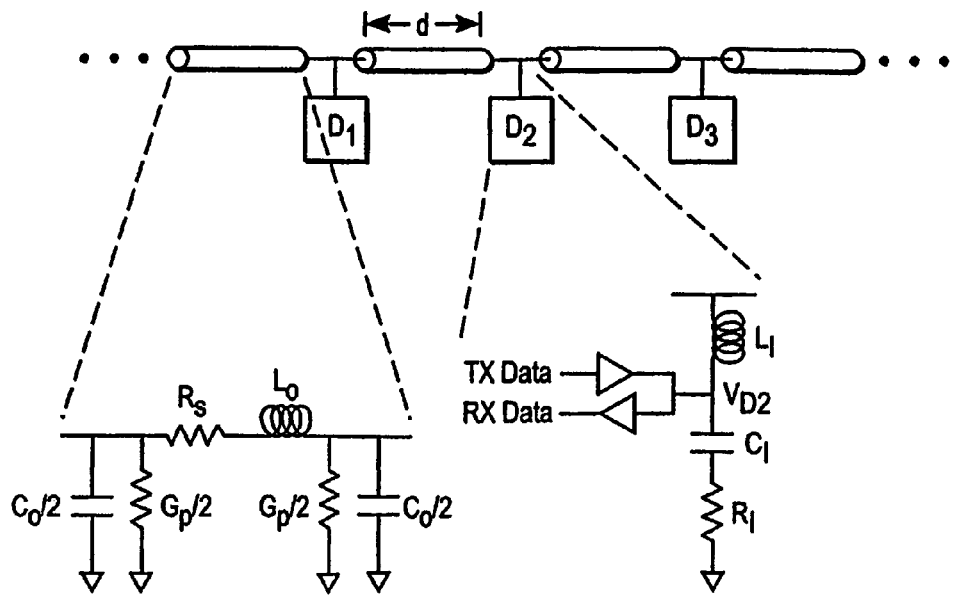
FIG. 3 is a model of the structure and electrical properties of the Bus System of FIG. 2.
Figure 4:
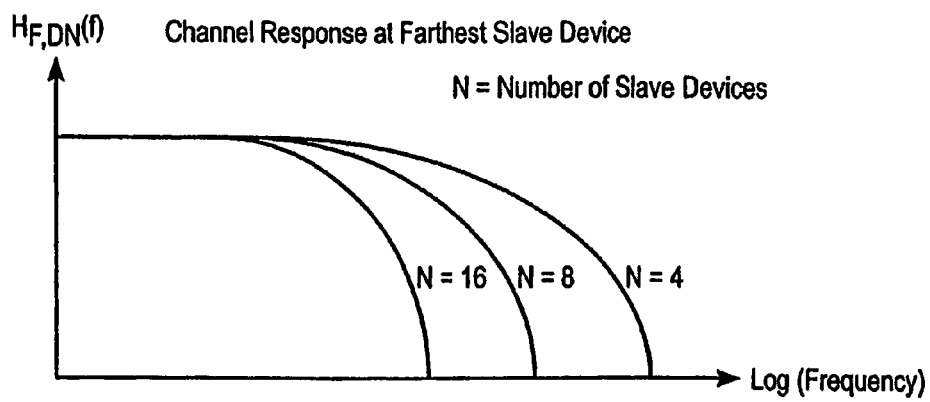
FIG. 4 graphs the channel response of devices in the Bus System of FIG. 3 versus the total number of devices.
Figure 5:
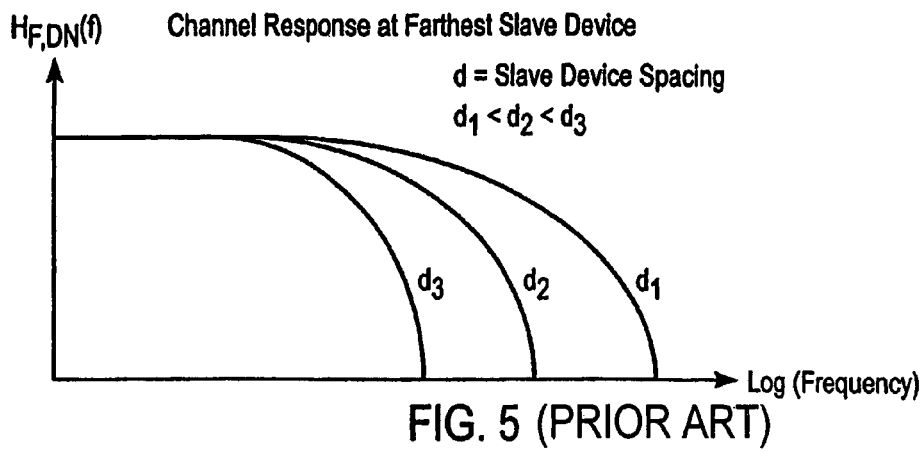
FIG. 5 graphs the channel response of devices in the Bus System of FIG. 3 versus the spacing between devices.
Figure 6:
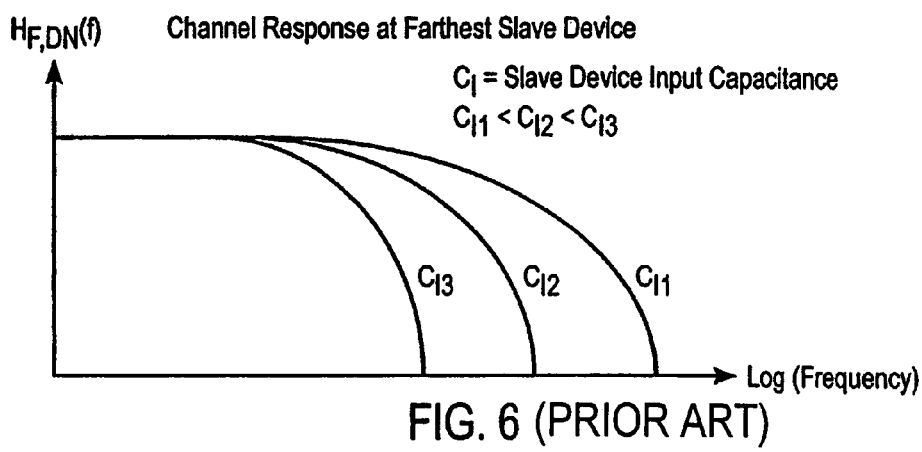
FIG. 6 graphs the channel response of devices in the Bus System of FIG. 3 versus device input capacitance.
Figure 7:
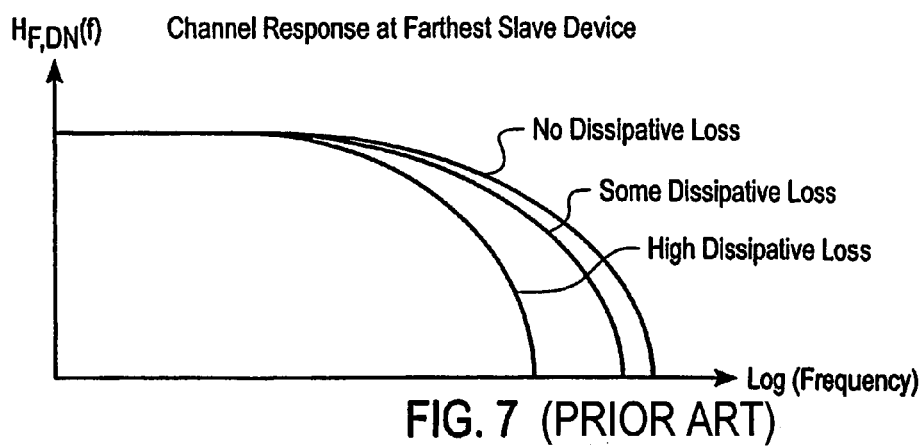
FIG. 7 graphs the channel response of devices in the Bus System of FIG. 3 versus dissipative loss.
Figure 8:
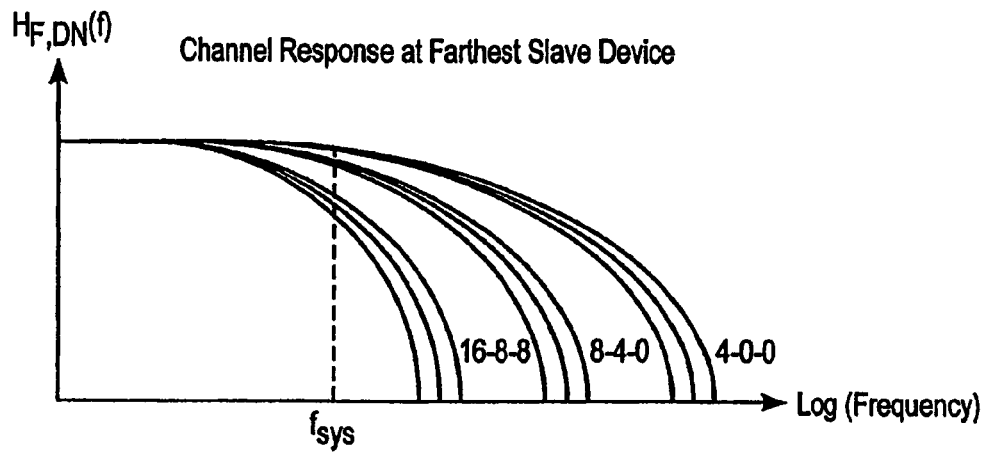
FIG. 8 graphs the channel response of devices in the Bus System of FIG. 3 versus the number of Modules and their populations.
Figure 9:
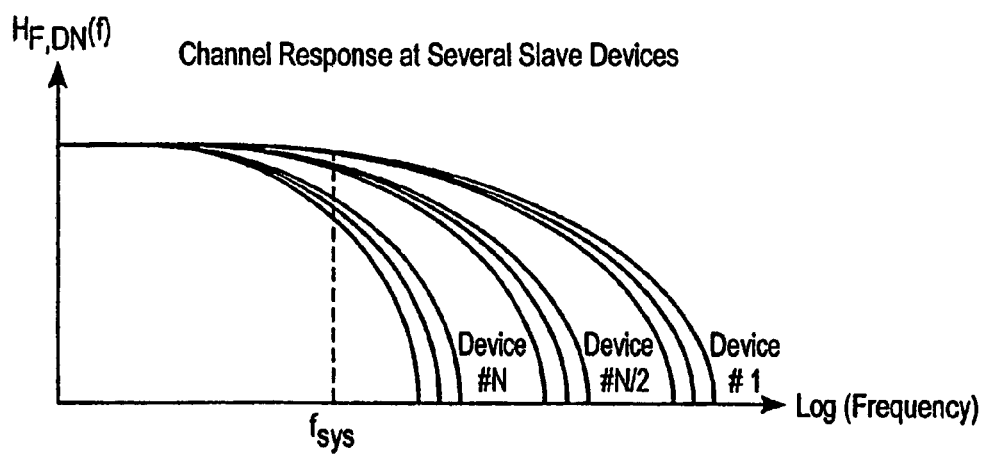
FIG. 9 graphs the channel response of several devices in the Bus System of FIG. 3.
Figure 10:
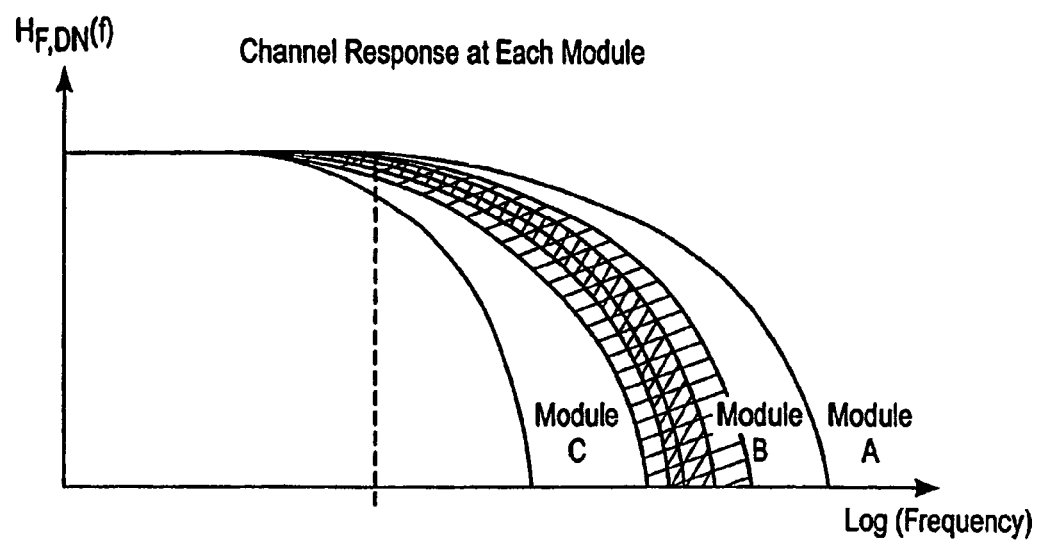
FIG. 10 graphs channel response of modules in the Bus System of FIG. 3.
Figure 11A:
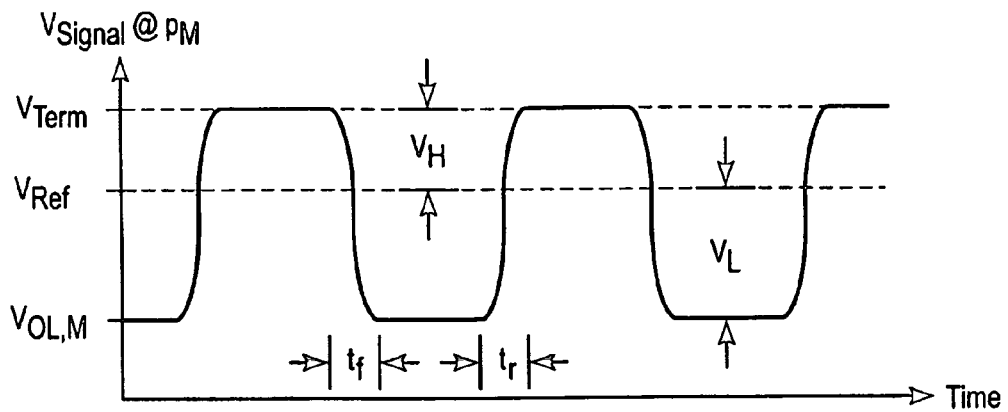
FIG. 11A graphs the amplitude of a signal at the time of transmission by a Master of Bus System.
Figure 11B:
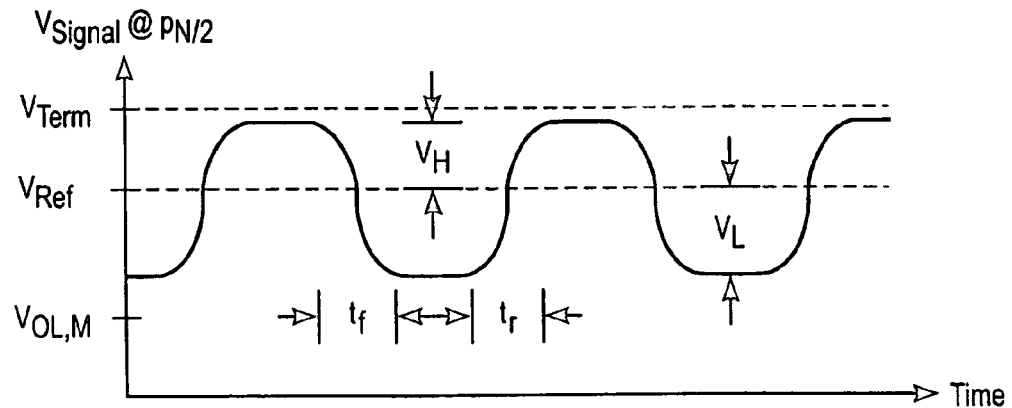
FIG. 11B graphs the amplitude of the signal of FIG. 11a at a point approximately in the middle of the Bus.
Figure 11C:
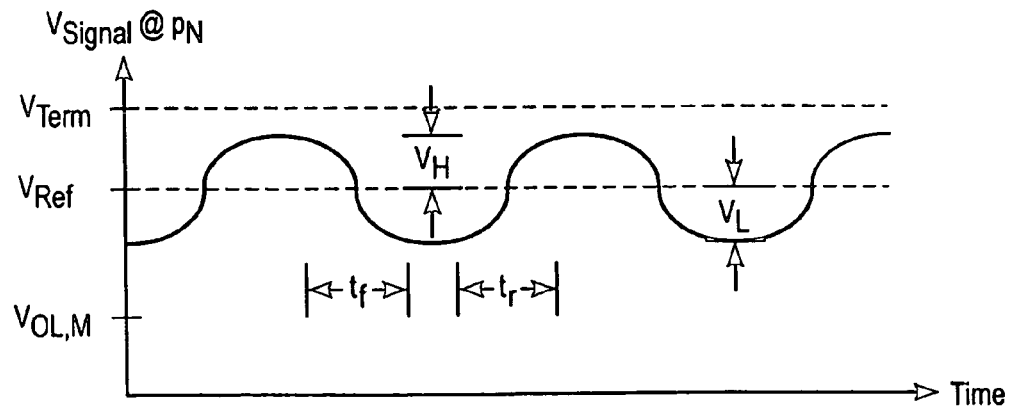
FIG. 11C graphs the amplitude of the signal of FIG. 11a near the end of the Bus.
Figure 12A:
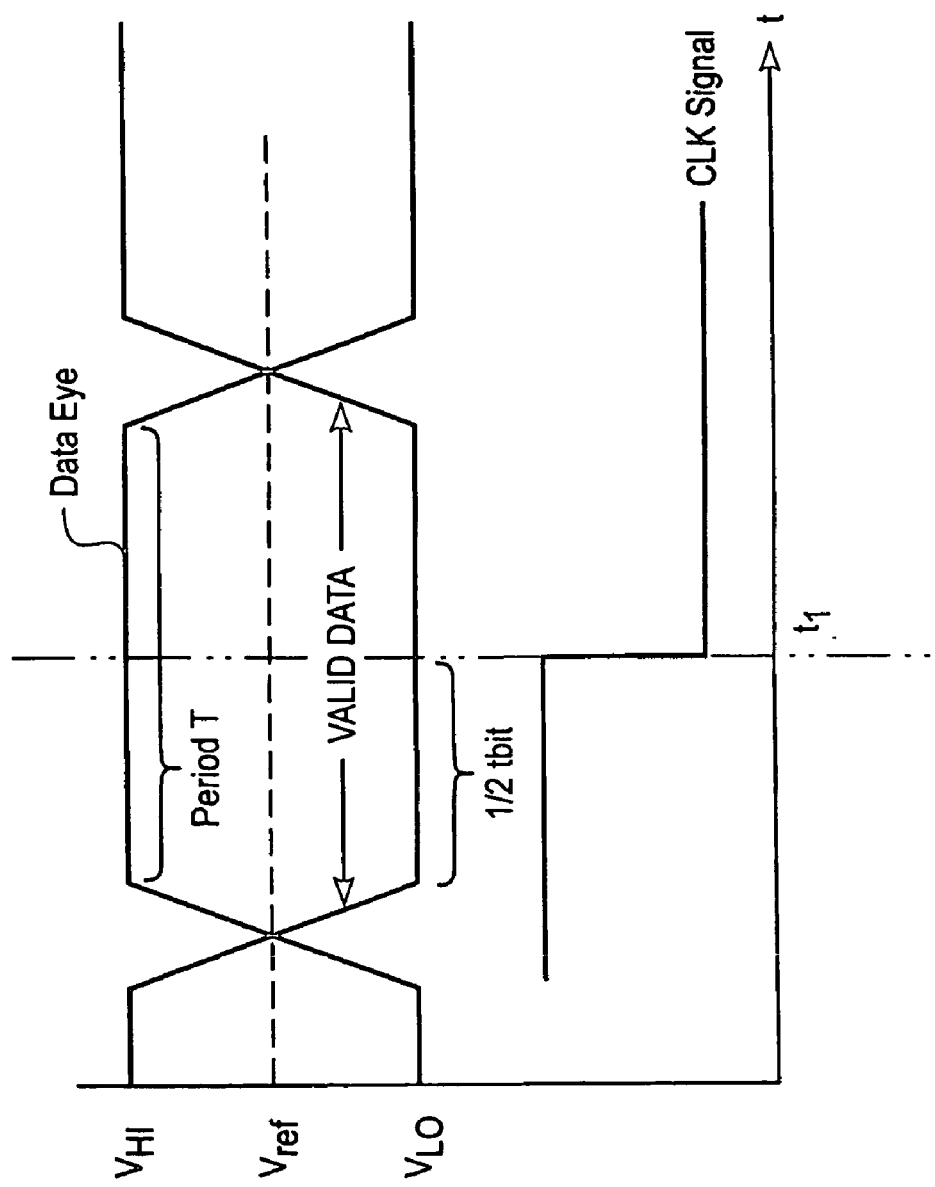
FIG. 12A is a timing diagram illustrating the ideal relationship between a data signal and a receiving device's receive clock signal.
Figure 12B:
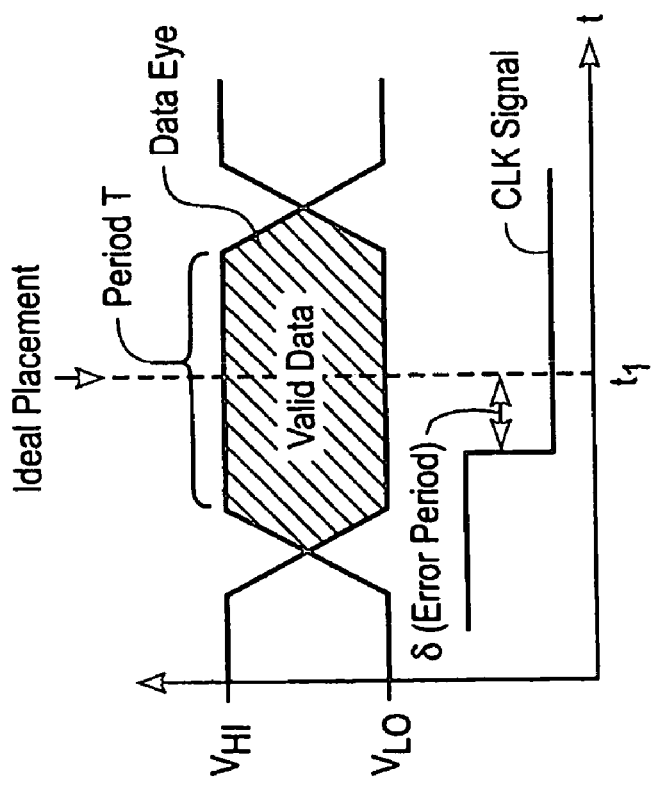
FIG. 12B is a timing diagram illustrating a receive clock signal transition occurring early in the data eye by an error period of δ.
Figure 12C:
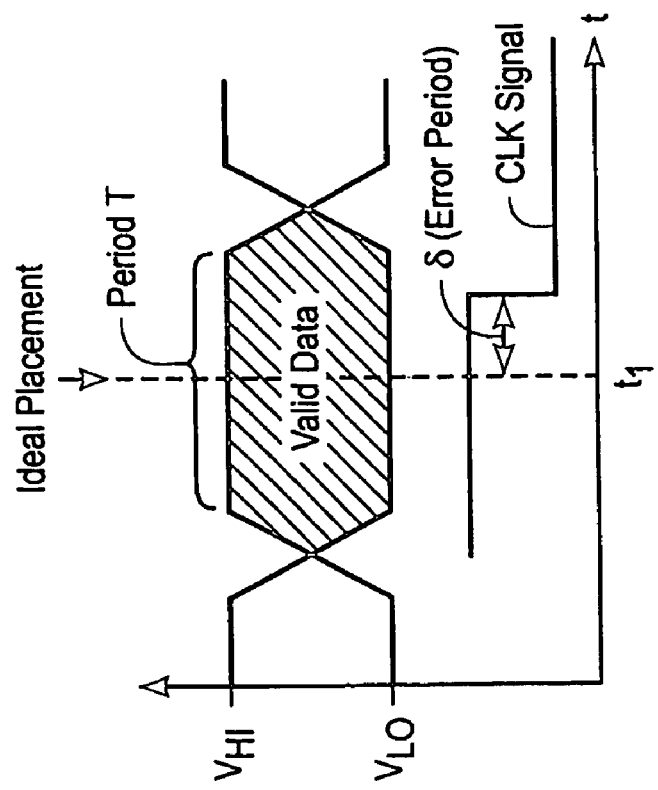
FIG. 12C is a timing diagram illustrating a transmit clock transition occurring late in the data eye by an error period of δ.
Figure 13:
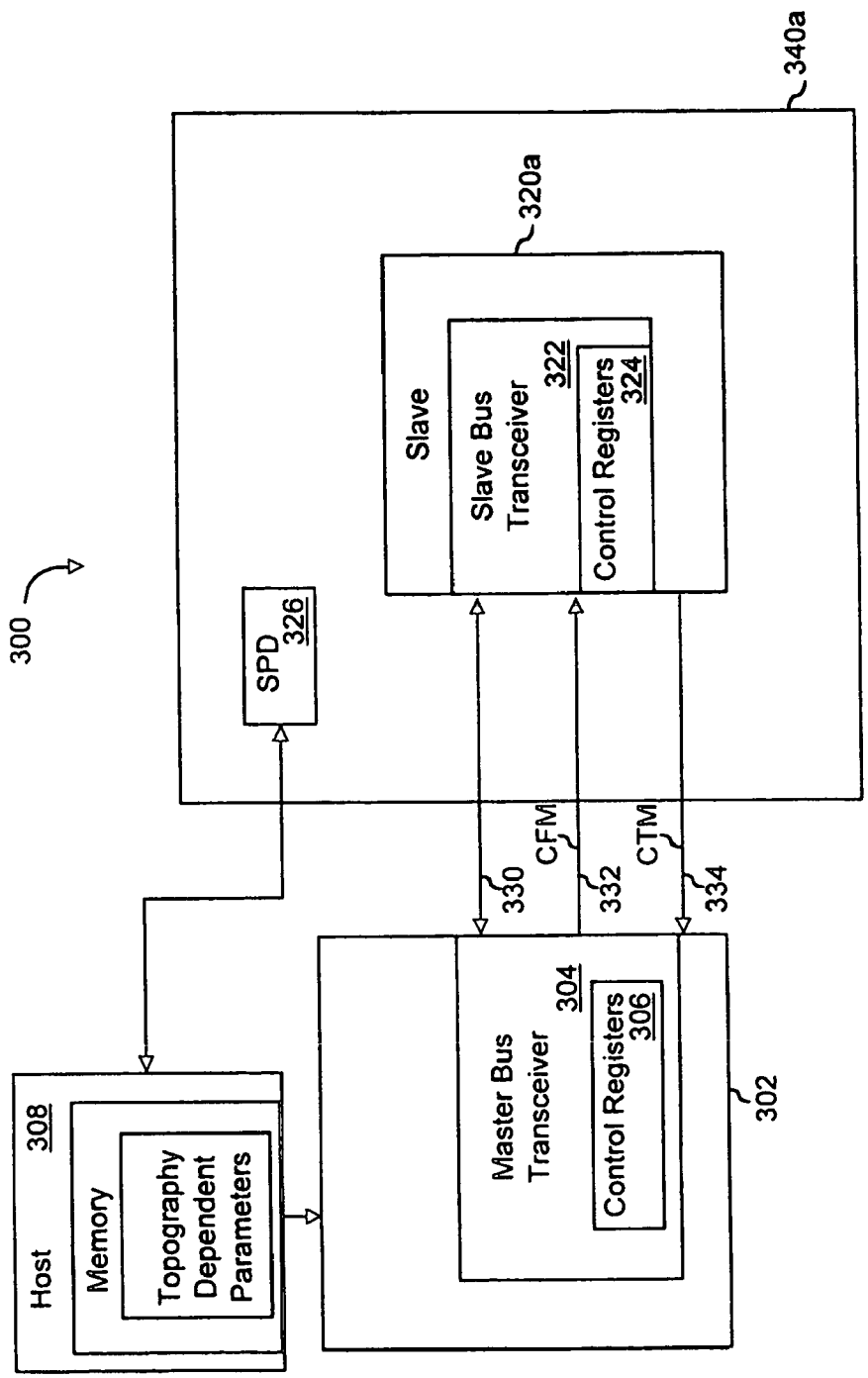
FIG. 13 illustrates a Bus System including the Master Bus Transceiver and Slave Bus Transceiver of the present invention.

The block diagram of FIG. 13 illustrates a Bus System 300 including Master Bus Transceiver 304 and/or Slave Bus Transceivers 322 of the present invention. Master Bus Transceiver 304 and Slave Bus Transceivers 322 improve bus communications by adjusting their associated transmit and/or receive signal characteristics based upon each transceiver's topography within the topography Bus System 300. Topography may be defined in terms of slave position and system configuration, or in terms of either slave position or system configuration. As used herein, position refers to the position of each Slave 320 on Bus 330 with respect to Master 302. In contrast, system configuration refers herein to the position on Bus 330 of the Module including the Slave 320 and the total number of Slaves in each Module 340.

Slave Bus Transceiver 322 will be described in detail with respect to FIGS. 15–23 and the Master Bus Transceiver 304 will be described in detail with respect to FIGS. 24 and 16–23.

A. Bus System Overview

Bus System 300 includes Master Device (Master) 302, which controls a multiplicity of Slave Devices (Slaves) 320, only one of which, Slave 320a, is illustrated. Master 302 may also communicate with other masters (not shown). Master 302 may be realized using a microprocessor, a digital signal processor, a graphics processor, a peripheral controller, an input/output (I/O) controller, a direct memory access (DMA) controller, a memory controller, or a communications device. Slaves 320 are typically realized as memory devices, such as dynamic random access memories (DRAMs), static random access memories (SRAMs), video random access memories (VRAMs), electrically programmable read only memories (EPROMs), and flash EPROMs, for example.

Master 302 and Slaves 320 communicate via high-speed Bus 330. For simplicity, Bus 330 is illustrated as a single line, or channel, although it may include a multiplicity of address, data and control lines. Master 302 and Slaves 320 communicate synchronously using clock signals on lines 332 and 334. The CFM signal on line 332 is used to synchronize data to be written to Slaves 320 by Master 304. The CTM signal of line 334 is used to synchronize data to be read from Slaves 320 by Master 304. To provide system flexibility Bus 330 includes several connector slots for inserting individual Slaves 302 or Modules of Slaves (Modules) 340, only one of which is illustrated. In one embodiment, Bus 330 includes three connector slots for three Modules 340. Each Module 340 may include any number of Slaves 302, such as, for example, none, four or eight. Additionally, each Module 340 includes a supplemental memory device called a Serial Presence Detect (SPD) 326, which stores module population data about an associated Module 340. Module population data includes, but is not limited to, the number of Slaves 320 included on Module 340. Modules 340 may be easily added, removed, or replaced to reconfigure Bus System 300. Modification of the configuration of Bus System 300 also modifies the electrical signal characteristics of Bus 330.

To improve communication Bus System 300 supports signal characteristic adjustments in the Slave Bus Transceivers 322 (only one of which is illustrated) and Master Bus Transceiver 304. Host 308 determines the system configuration and bus locations of the slave devices, accesses Topography Dependent Parameters in a memory, determines from that information a set of topography dependent parameters and distributes them to the Master 302 and to the slave devices via the Master 302. Slave Bus Transceiver 322a receives signals transmitted by Master 302 to Slave 320a via Bus 330 and transmits signals to Master 302 from Slave 320a via Bus 330. Based upon topography dependent parameters, Slave Bus Transceiver 322 adjusts receive signal characteristics, transmit signal characteristics, or both depending upon the embodiment implemented. Slave Bus Transceiver 322a may adjust any, all, or some combination of, transmit signal characteristics, including, but not limited to, slew rate, current swing, asymmetry, transmit center timing, and cross-talk and temporal equalization. Slave Bus Transceiver 322a may also adjust any, all, or some combination of, receive signal characteristics, including, but not limited to, receive timing center and voltage threshold(s). Slave Bus Transceiver 322a adjusts its signal characteristics in response to topography dependent parameter stored in Control Registers 324. Depending upon the signal characteristics to be adjusted, Control Registers 324 may include a slew rate control register, a current control register for controlling the current swing of the transmit signal, a symmetry control register, a transmit timing center control register, an equalization control register, a threshold control register, and a receive timing center control register. Host 308 determines the topography dependent parameter to be stored in each control register of Control Registers 324 based upon the topography of Bus System 300. In other words, Control Registers 324 store topography dependent parameters with which selected transmit and/or receive signal characteristics may be modified. How Host 308 determines the topography dependent parameters to be stored in the Control Registers 324 of each Slave 320 will be discussed below with respect to Host 308 and FIG. 14.

Master Bus Transceiver 304 receives signals transmitted by each Slave 320 to Master 302 via Bus 330 and transmits signals to each Slave 320 from Master 302 via Bus 330. Based upon topography dependent parameters, Master Bus Transceiver 304, on a slave-by-slave, or module-by-module basis, adjustment of receive signal characteristics, transmit signal characteristics, or both depending upon the embodiment implemented. Like Slave Bus Transceiver 322a, Master Bus Transceiver 304 may adjust any, all, or some combination of, transmit signal characteristics and any, all, or some combination of, receive signal characteristics. Preferably, implementation of Master Bus Transceiver 304 will be complementary to the implementation of Slave Bus Transceivers 322. Thus, if a Slave Bus Transceiver 322 has already adjusted its transmit signal characteristics based upon topography dependent parameters prior to transmission to Master 302 then Master Bus Transceiver 304 may not need to adjust its receive signal characteristics to compensate for topography dependent channel effects. Master Bus Transceiver 304 adjusts its signal characteristics in response to topography dependent parameters for each Slave 320. Depending upon the signal characteristics to be adjusted, Control Registers 306 may include for each Slave 320 within Bus System 300 a slew rate control register, a current control register for controlling the current swing of the transmit signal, a symmetry control register, a transmit timing center control register, an equalization control register, a threshold control register, and a receive timing center control register. Host 308 determines the topography dependent parameters to be stored in each control register of Control Registers 306 based upon the configuration and/or position of each Slave 320 on Bus 330. How the topography dependent parameters to be stored in the Control Registers 306 are determined will be discussed below with respect to Host and FIG. 14.

B. Determination of Topography Dependent Parameters

Figure 14:
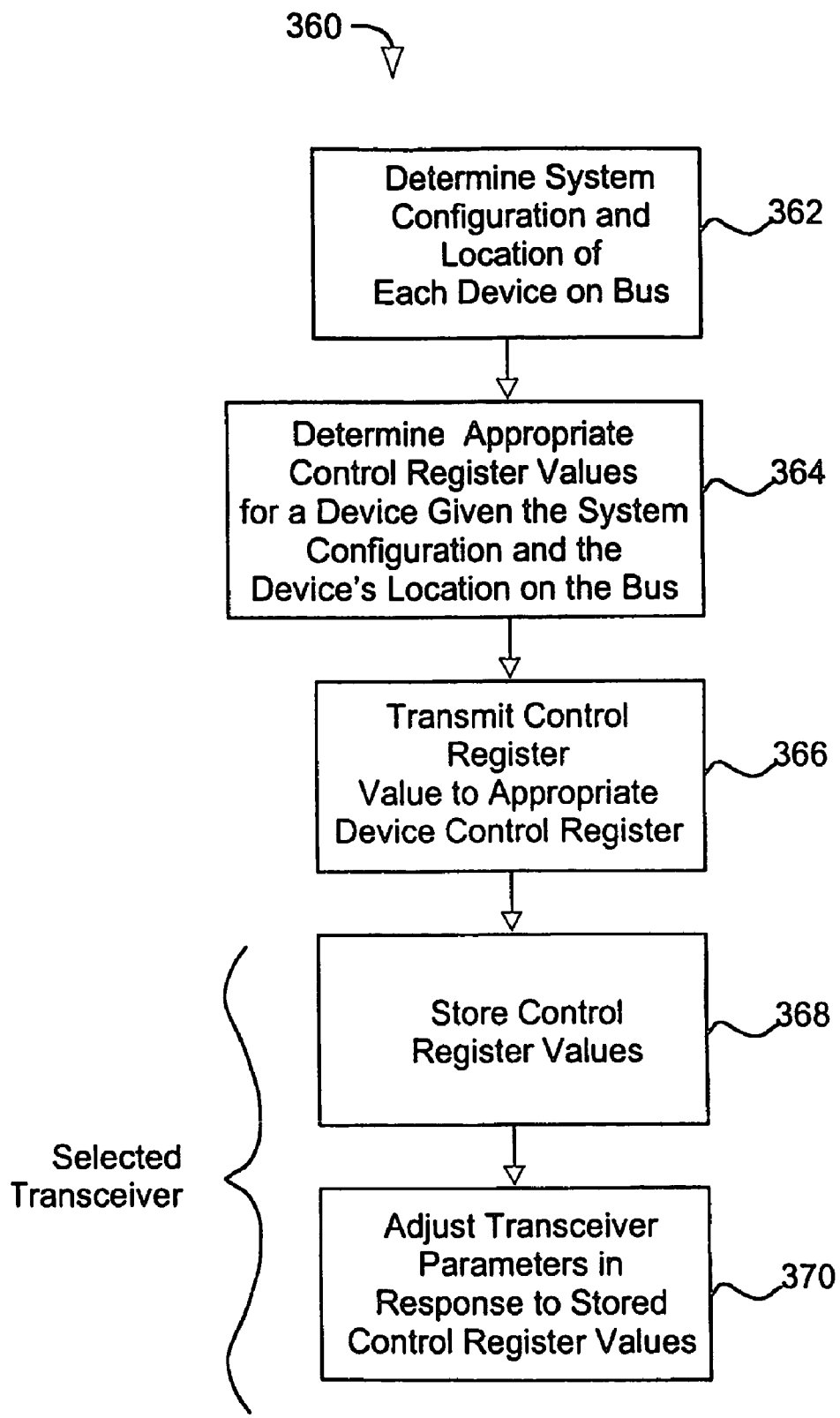
FIG. 14 is a flow diagram of a process implemented by the Bus System of the present invention to improve signal characteristics in response to topography dependent parameters.

FIG. 14 illustrates in flow diagram form process 360 to determine topography dependent characteristics in response to topography data. Process 360 begins in response to an initiating event, such as, for example, addition, removal, or modification of a Module 340, system power-up, or the passage of some period of time. During step 362 an intelligent agent determines the system configuration and the bus location of each Slave 320 within the topography of Bus System 300. The intelligent agent responsible for executing step 362 is preferably Host 308. If topography is to be defined in terms of system configuration, during step 362 the SPDs 326 (see FIG. 13) associated with each Module 340 may be polled to determine the number of Modules 340 and the number and Device IDs of all Slaves 320 on each Module 340. In other words, during step 362 the topography of Bus System 300 is first determined. Given the topography of Bus System 300, the bus location of each Slave 320 can be determined with respect to Master 302. Consider for example the case when Bus System 300 includes three Modules at three bus locations. Suppose also that it is discovered that the first Module 340 includes eight Slaves 320, the second includes four Slaves 320 and the third Module 340 includes eight Slaves 320. Under these conditions, the eight Slaves 320 on the first Module 340 are determined to have the first bus location, the four slaves on the second Module 340 are assigned the second bus location, and the eight slaves on the third Module are assigned the third bus location.

On the other hand, if topography is to be defined in terms of position on Bus 330 with respect to Master 302, a number of methods may be used during step 362 to determine the topography of each Slave 320. In one embodiment, a serial chain (not shown) can be used to enumerate Slaves 320. The first Slave 320 encountered by Master 302 on the serial chain is closest to Master 302 and is assigned a first topography and Device ID. Master 302 then commands the first Slave 320 to poll the next Slave 320 on the chain. The responding Slave 320 is assigned a second topography Device ID. Enumeration of Slaves 320 continues until no response is received to a poll request on the serial chain.

Having determined the topography of each Slave 320 within Bus System 300, the intelligent agent uses the topography of Bus System 300 to determine appropriate values for the topography dependent parameters to be stored in Control Registers 306 and/or Control Registers 324 (step 364). Any number of methods may be used to obtain the value of each topography dependent parameter consistent with the present invention. For example, appropriate topography dependent parameter values may be obtained empirically, for example by looking up appropriate values in a table and/or by computing the parameter values in accordance with various predefined functions, and then conveying the determined parameter values to the Master 302 and Slaves 320. In some embodiments, a software procedure is used to generate values for the topography dependent parameters, while in other embodiments a hardware based table lookup methodology is used. For example, the N Slaves 320 closest to Master 302 may be assigned a value x, the next N Slaves 320 may be assigned a value of x+Δ, etc. According to another method, the Slave 320 closest to Master 302 is assigned a value of y, the second Slave 320 is assigned a value of y+Δ, the third slave is assigned a value of y+2Δ, etc. According to yet another method, if Bus System 300 includes more than N Slaves 320 then all Slaves 320 are assigned a value of w, and if there are less than N Slaves 320 then all Slaves 320 are assigned a value of z.

Having determined the values for the topography dependent parameters, Process 360 continues with step 366. During step 366 Master 302 transmits the topography dependent parameters to each device in Bus System 300 whose transmit or receive signal characteristics are to be adjusted.

During step 368 each device, Master 302 or Slave 320, receives topography dependent parameters and stores them in appropriate control registers of Control Registers 306 or Control Registers 324, as the case may be. Subsequently, during step 370 these topography dependent parameters are used by the device to adjust receive and/or transmit signal characteristics to improve bus communications. How the topography dependent parameters are used will be discussed in detail below with respect to specific signal characteristics and FIGS. 16–23.

C. The Slave Bus Transceiver

Figure 15:
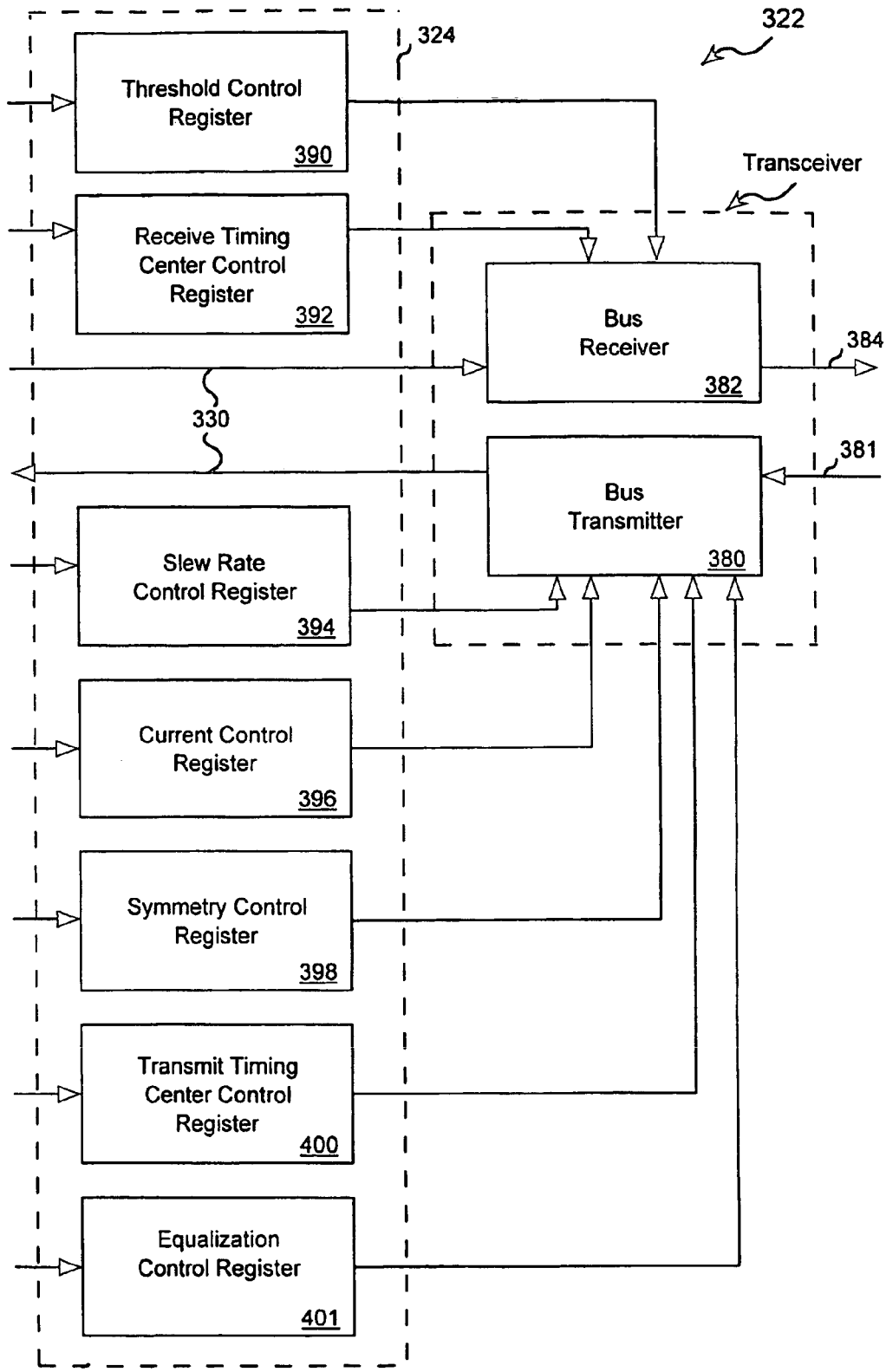
FIG. 15 is a block diagram of an embodiment of a Slave Bus Transceiver of the present invention capable of adjusting several receive and transmit signal characteristics.

FIG. 15 illustrates in block diagram form an embodiment of Slave Bus Transceiver 322 capable of adjusting any of several receive and transmit signal characteristics. Slave Bus Transceiver 322 includes Control Registers 324, Bus Transmitter 380 and Bus Receiver 382. In the illustrated embodiment, Control Registers 324 include two registers for storing topography dependent parameters associated with receive signal characteristics. The first, Threshold Control Register 390, permits adjustment of the value of $V_{ref}$ for received signals, where $V_{ref}$ determines the voltage level between 0 and 1 signal values. The second, Receive Timing Center Control Register 392, permits adjustment of a receive clock signal so that a received data signal is sampled near the center of the data eye. In alternate embodiments, Control Registers 324 may include a Threshold Control Register and a Receive Timing Register per channel of Bus 330. Control Registers 324, as illustrated, also include four registers for storing topography dependent parameters associated with transmit signal characteristics. Slew Rate Control Register 394 stores a topography dependent parameter for adjusting the slew rate of transmitted signals. Current Control Register 396 stores a topography dependent parameter for producing full swing signals at the output pins of a transmitting device. Symmetry Control Register 396 stores a topography dependent parameter for adjusting the voltage level of transmitted signals with respect to $V_{ref}$. Transmit Timing Center Control Register 400 stores a topography dependent parameter for adjusting a transmit clock signal so the transmitted signal will be received by Master 302 near the center of the data eye. Equalization Control Register 401 stores a topography dependent parameter for equalizing the transmitted signal to account to temporal and/or spatial variations in voltage margins. In alternate embodiments, Control Registers may include one Slew Rate Control Register, one Current Control Register, one Symmetry Control Register, one Transmit Timing Center Control Register and one set of Equalization Control Registers per channel of Bus 330.

Bus Transmitter 380 receives internally generated data on line 381, buffers it and drives the transmit data to Bus 330. Depending upon the embodiment, Bus Transmitter 380 may also adjust the parameters of the transmit data in response to topography dependent parameters stored in Control Registers 324. How Bus Transmitter 380 adjusts the various parameters of the transmit data will be described in detail with respect to FIGS. 16–20 and FIGS. 26A–26B.

Bus Receiver 382 receives data from Bus 330, buffers it, and drives the receive data onto line 384 for internal use by Slave 320. Bus Receiver 382 may also adjust the parameters of the receive data in response to topography dependent parameters from Control Registers 324, depending upon the embodiment. How Bus Receiver 382 does this will be discussed in detail with respect to FIGS. 21–23.

C1. The Bus Transmitter

Figure 16:
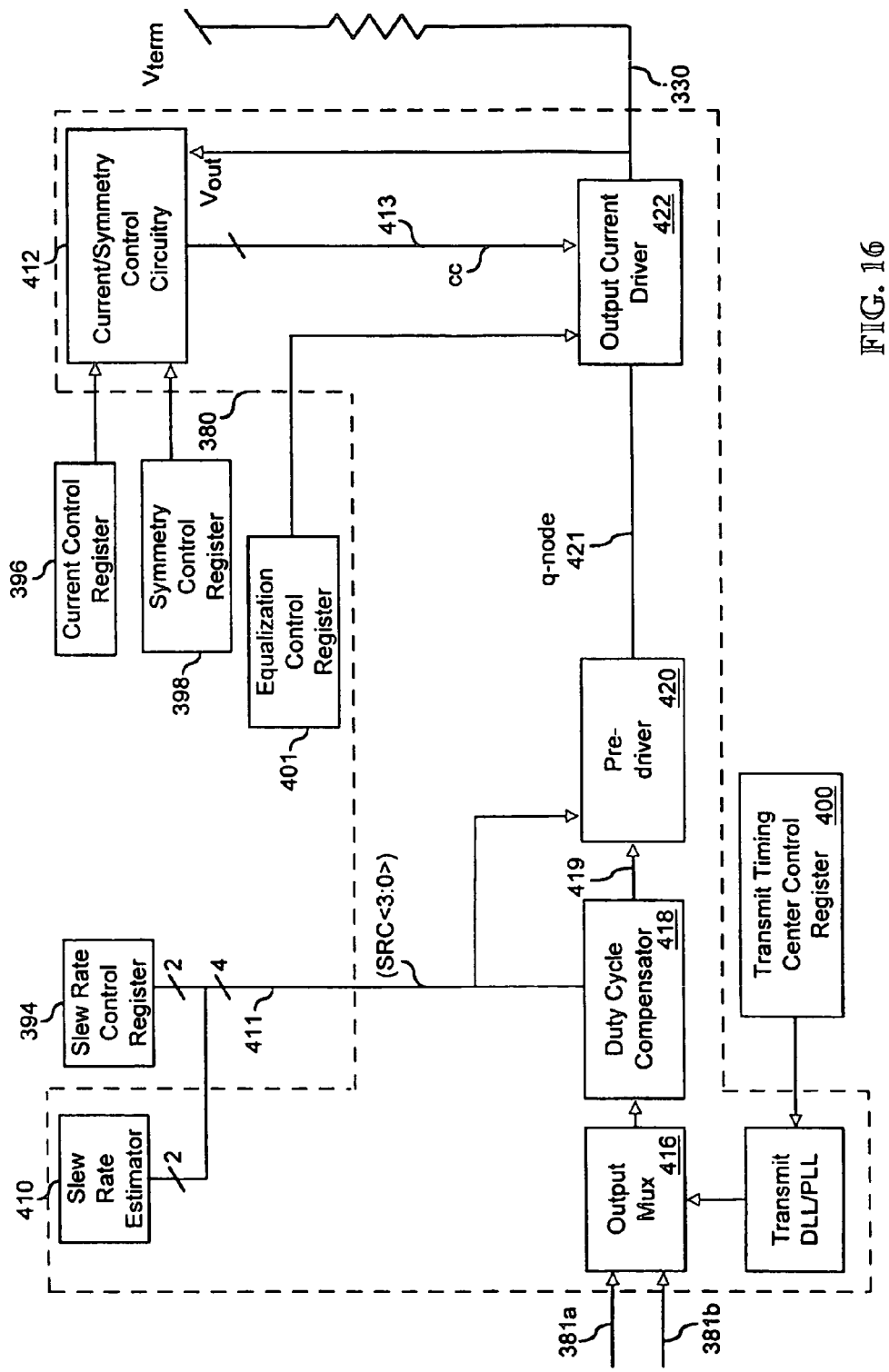
FIG. 16 is a block diagram of an embodiment of the Bus Transmitter associated with Slave Bus Transceiver of FIG. 15.

FIG. 16 illustrates in block diagram form Bus Transmitter 380. Bus Transmitter 380 includes circuitry for adjusting the transmit signal's timing center, slew rate, current swing and symmetry in response to various control signals. Additionally, Bus Transmitter 380 equalizes signal characteristics prior to transmission to increase voltage margins. In the illustrated embodiment, Bus Transmitter 380 includes a Transmit DLL/PLL, Output Multiplexer (MUX) 416, Predriver 420, and Output Current Driver 422. Also included in the illustrated embodiment are Duty Cycle Compensator 418 and Slew Rate Estimator 410, which while compatible with the present invention are not necessary to it.

The Transmit DLL/PLL generates a transmit clock, which is coupled to Output Multiplexer 416. The Transmit DLL/PLL adjusts the timing of the rising edge of the transmit clock to ensure that the signals transmitted by Output Current Driver 422 will arrive in response to the topography dependent parameter stored in Transmit Timing Center Control Register 400. By adjusting the clock used to transmit the data signal, Transmit Timing Center Control Register 400 can vary when the data signal is transmitted so that the data signal will be sampled by a receiving device near a desired position within the data eye, for example, the center of the data eye or a position offset from the center of the data eye. Output Multiplexer 416 receives odd data to be transmitted on line 381a and even data on line 381b and generates clocked data in response to the transmit clock signal from the Transmit DLL/PLL. Output Multiplexer 416 outputs the clocked data on line 417.

In the illustrated embodiment, there are two sources of slew rate control signals, Slew Rate Estimator 410 and Slew Rate Control Register 394. In this embodiment, Slew Rate Estimator 410 sets a baseline slew rate that can be varied in accordance with the topography dependent parameter stored in Slew Rate Control Register 394. Slew Rate Estimator 410 generates two signals, SRC<3:2>, each representing a single bit of the slew rate control signal. Circuitry for estimating slew rate are well known in the art. The topography dependent parameter stored in Slew Rate Control Register 394 represents an adjustment to that baseline slew rate. In alternate embodiments, Slew Rate Estimator 410 may be omitted and the slew rate may be completely controlled via Slew Rate Control Register 394.

In the illustrated embodiment, both Duty Cycle Compensator 418 and Predriver 420 are responsive to slew rate control signals. Duty Cycle Compensator 418 receives clocked data on line 417, anticipates the changes in the duty cycle that will be caused by Predriver 420 in response to the slew rate control signals and pre-compensates for that change in duty cycle. Duty Cycle Compensator 418 couples its output signal to Predriver 420 on line 419. Duty Cycle Compensator 418 will be further described with respect to FIG. 17. In alternative embodiments of Bus Transmitter 380, Duty Cycle Compensator 418 may be omitted and the signal on line 417 may be connected directly to Predriver 420. Predriver 420 adjusts the slew rate of the transmit data in response to the slew rate control signals. Predriver 420 couples its output signals to q-node 421. Predriver 420 will be further described with respect to FIG. 18.

The Current/Symmetry Control bits, cc, are used by Output Current Driver 422 to adjust the voltage swing of the output signals and to adjust the average value of the output signals with respect to $V_{ref}$. Output Current Driver 422 will be described in detail with respect to FIG. 19. Current/Symmetry Control Circuitry 412 generates the current/symmetry control bits in response to topography dependent parameters from Current Control Register 396 or Symmetry Control Register 398. Current/Symmetry Control Circuitry 412 will be described in detail with respect to FIG. 20.

Output Current Driver 422 uses control signals provided by Equalization Control Register 401 to equalize the output signals and increase the voltage margins at a receiving device such as Master 302. Using a topography dependent parameter stored in Equalization Control Register 401, Output Current Driver 422 is able to dynamically change its drive strength to compensate for residual and cross-coupled signals present on the channel. Embodiments of Output Current Driver 422 capable of equalizing signals will be described below with respect to FIGS. 26A and 26B.

The Duty Cycle Compensator

Figure 17:
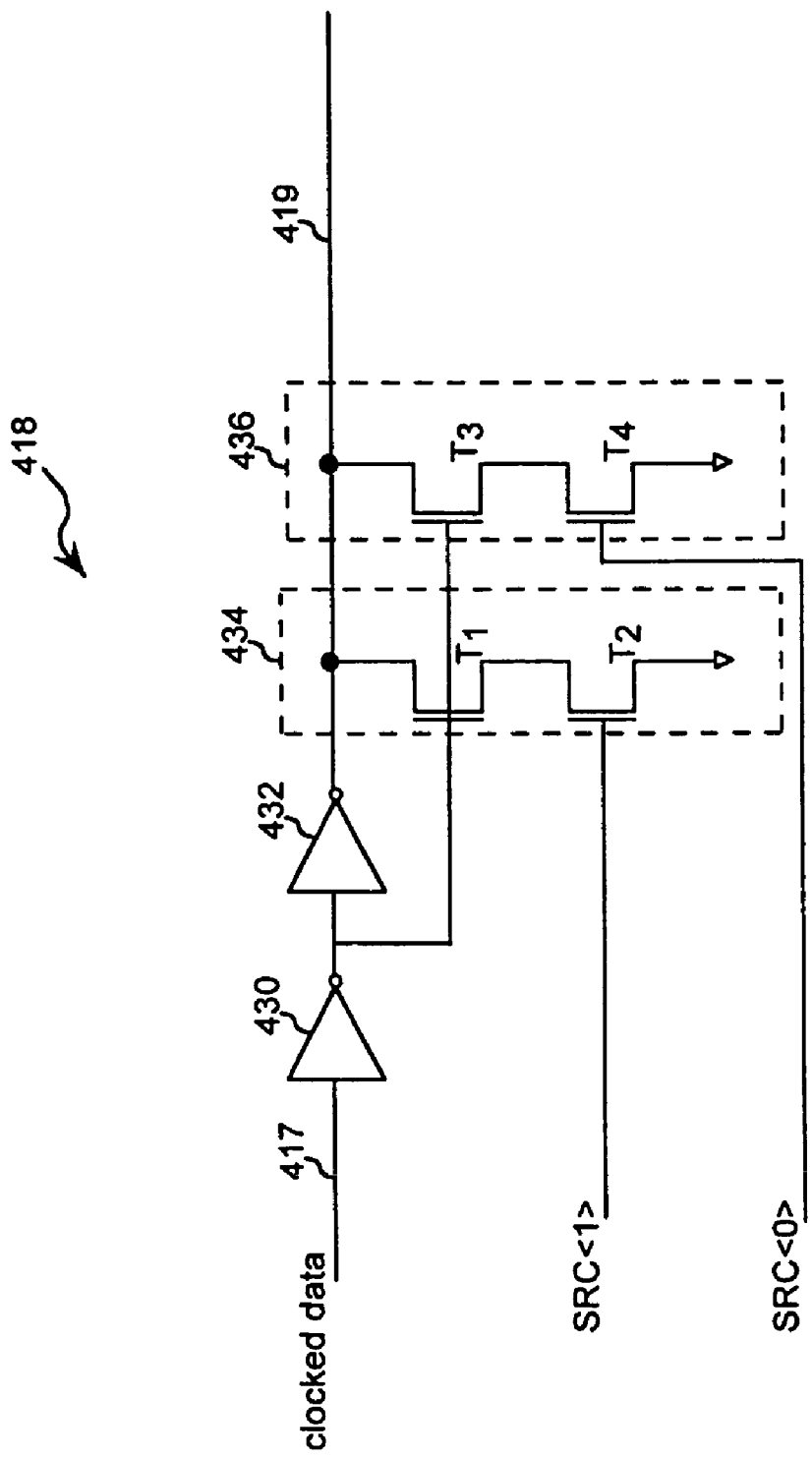
FIG. 17 is a schematic diagram of an embodiment of the Duty Cycle Compensator associated with the Bus Transmitter of FIG. 16.

FIG. 17 illustrates schematically Duty Cycle Compensator 418 of FIG. 16. Duty Cycle Compensator 418 pre-compensates for distortion of the duty cycle caused by the slew rate control blocks of Predriver 420 when the slew rate control signals SRC<1:0> are enabled. In response to the slew rate control signals, SRC<1:0>, Duty Cycle Compensator 418 pre-compensates the data signals being input to Predriver 420 such that the distortion caused by Predriver 420 is canceled out in the q-node signal at q-node 421. In other words, Duty Cycle Compensator 418 modifies the duty cycle of the clocked data signal on line 417 by a predetermined amount in response to slew rate control signals SRC<1:0>.

Duty Cycle Compensator 418 has a pair of series-connected Inverters 430 and 432 and two parallel Transistor Stacks 434 and 436. Transistor Stacks 434 and 436 each include a pair of n-type transistors connected in series between the output of Inverter 432 and ground. The input to upper transistors $T_1$ and $T_3$ is the signal output by Inverter 432. The slew rate control bits connect to the gate of the lower transistors $T_2$ and $T_4$. A high voltage level on the slew rate control bits enables Stacked Transistors 246, 248 to adjust the duty cycle of the clocked data signal, by increasing the slew rate of high-to-low transitions on the input to Predriver 420. A low voltage level on the slew rate control bits disables Stacked Transistors 246, 248 and prevents the duty cycle of the clocked data signal on line 419 from being modified.

In an alternate embodiment, the lower transistors $T_2$ and $T_4$ may be weighted to provided additional range.

The Predriver

Figure 18:
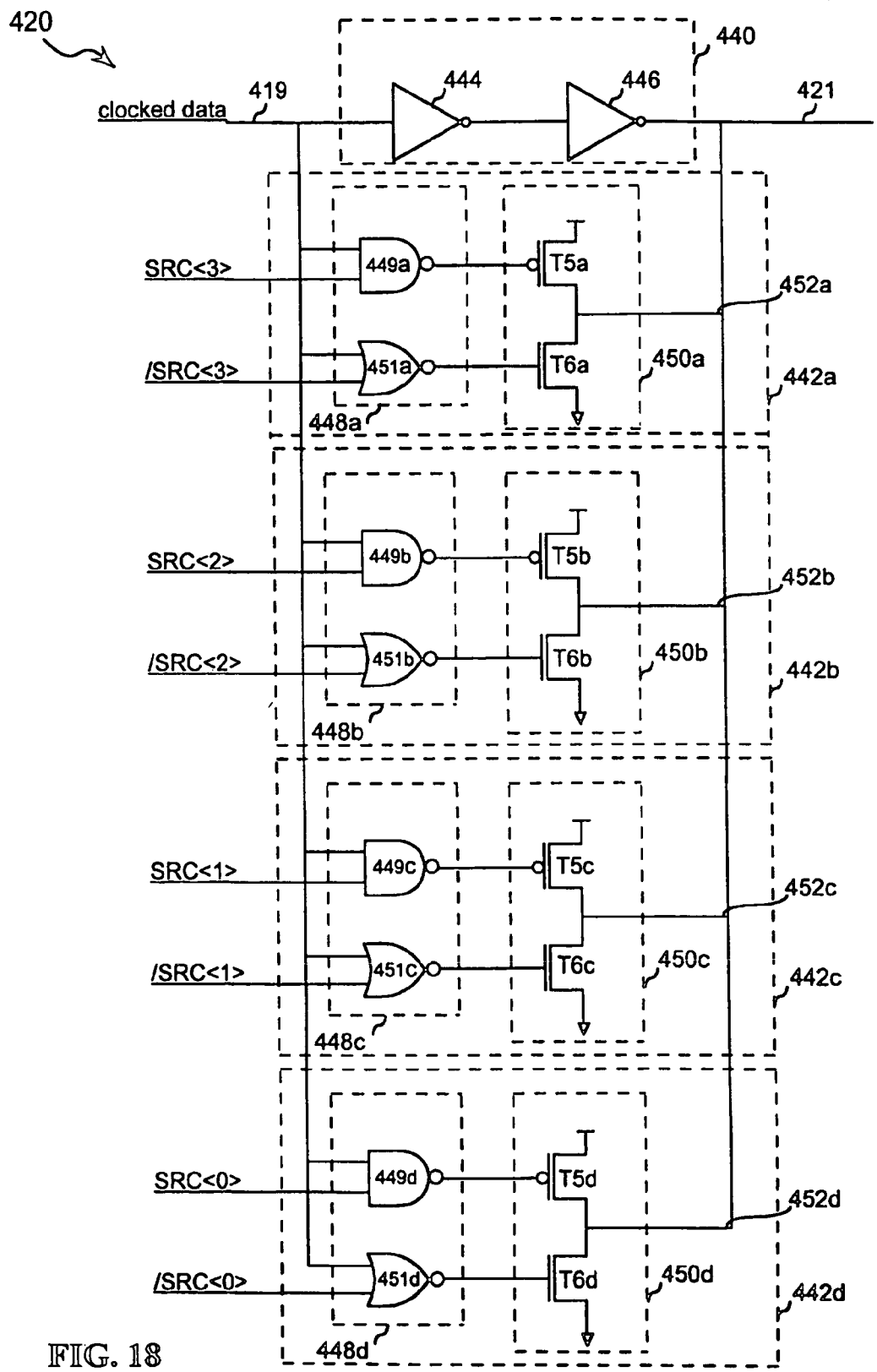
FIG. 18 is a schematic diagram of an embodiment of the Predriver associated with the Bus Transmitter of FIG. 16.

FIG. 18 illustrates schematically Predriver 420 of FIG. 16, which includes Base Block 440 and two Slew Rate Adjustment Blocks 442, one responsive to Slew Rate Estimator 410 and the other to Slew Rate Control Register 394. Predriver 420 uses the slew rate control signals from Slew Rate Estimator to set a nominal slew rate that it adjusts in response to a topography dependent parameter from Slew Rate Control Register 394.

Base Block 440 is always enabled and outputs a signal to q-node 421 that has an associated, predetermined slew rate. Base Block 440 includes Inverters 444 and 446 connected in series which are sized to provide both an appropriate slew rate and duty cycle.

In the illustrated embodiment, four Slew Rate Adjustments Blocks 442a–d are connected in parallel with Base Block 440, although any arbitrary number may be used consistent with the present invention. Slew Rate Adjustment Blocks 442a and 442b are responsive to slew rate control signals from Slew Rate Estimator 410. Slew Rate Control Blocks 442c and 442d are responsive to slew rate control signals from Slew Rate Control Register 394. The slew rate of the signal on line 421 increases with the number of enabled Slew Rate Adjustment Blocks 442. In one embodiment each Slew Rate Adjustment Block 442 includes a Control Block 448 connected in series with a Stacked Transistor Pair 450. When enabled by their associated slew rate control signals Control Blocks 448 enable their associated Stacked Transistor Pairs 450 to be responsive to the data signal on line 419. Each Control Block 448 includes a NAND gate 449 and a NOR gate 451. NAND gate 449 enables the p-channel transistor $T_5$ of Transistor Stack 450 and NOR gate 451 enables n-channel transistor $T_6$. The output 452 of each Stacked Transistor Pair 450 connects to q-node 421.

When slew rate control bit SRC<x> is at a high voltage level, NAND gate 449 is enabled to be responsive to the data signal on line 419, allowing it to drive Transistor $T_5$. At the same time, when SRC<x> is at a high voltage level, /SRC<x> is at a low voltage level which enables NOR gate 451 to be responsive to the data signal on line 419, allowing the data signal to drive the lower n-channel transistor $T_6$.

When the NAND gate 449 and NOR gate 451 are both enabled and when the data signal on line 419 transitions to a low voltage level, a high voltage level appears at the output of NOR gate 451. This causes lower n-type transistor $T_6$ to conduct current to ground thereby increasing the rate at which the q-node 421 is driven to ground. At substantially the same time that a high voltage level appears at the output of NOR gate 451, a high voltage level appears at the output of NAND gate 449 that causes the upper p-channel transistor $T_5$ to stop conducting current, turning off.

When the NAND gate 449 and NOR gate 451 are both enabled and the data signal on line 419 transitions to a high voltage level, a low voltage level appears at the output of NAND gate 449. This causes the upper p-channel transistor $T_5$ to conduct current thereby increasing the rate at which q-node 421 is driven to a high voltage level. At substantially the same time as a low voltage level appears at the output of NAND gate 449, a low voltage level appears at the output of NOR gate 451 that causes the lower n-channel transistor $T_6$ to turn off.

When SRC<x> is at a low voltage level and /SRC<x> is at a high voltage level, neither NAND gate 449 nor NOR gate 451 responds to the data signal and are thereby disabled, preventing any response by Transistor Stack 450.

In one embodiment, one Slew Rate Adjustment Block 442a increases the slew rate by 0.5 with respect to the Base Block 440, while the Slew Rate Adjustment Block 442b increases the slew rate by 1.5 with respect to the Base Block 440 etc. However, the Slew Rate Adjustment Blocks 204, 206 can provide other predetermined amounts of adjustment to the slew rate.

Slew Rate Adjustment Blocks 442 are sized to provide an appropriate slew rate without regard to the duty cycle to increase the range for each setting of the slew rate control bits. Therefore, activating the Slew Rate Adjustment Blocks will cause asymmetry in the duty cycle of the output voltage $V_{out}$, for which Duty Cycle Compensator 418 precompensates, as previously discussed with respect to FIG. 17.

The Output Current Driver and Current/Symmetry Control

Figure 19:
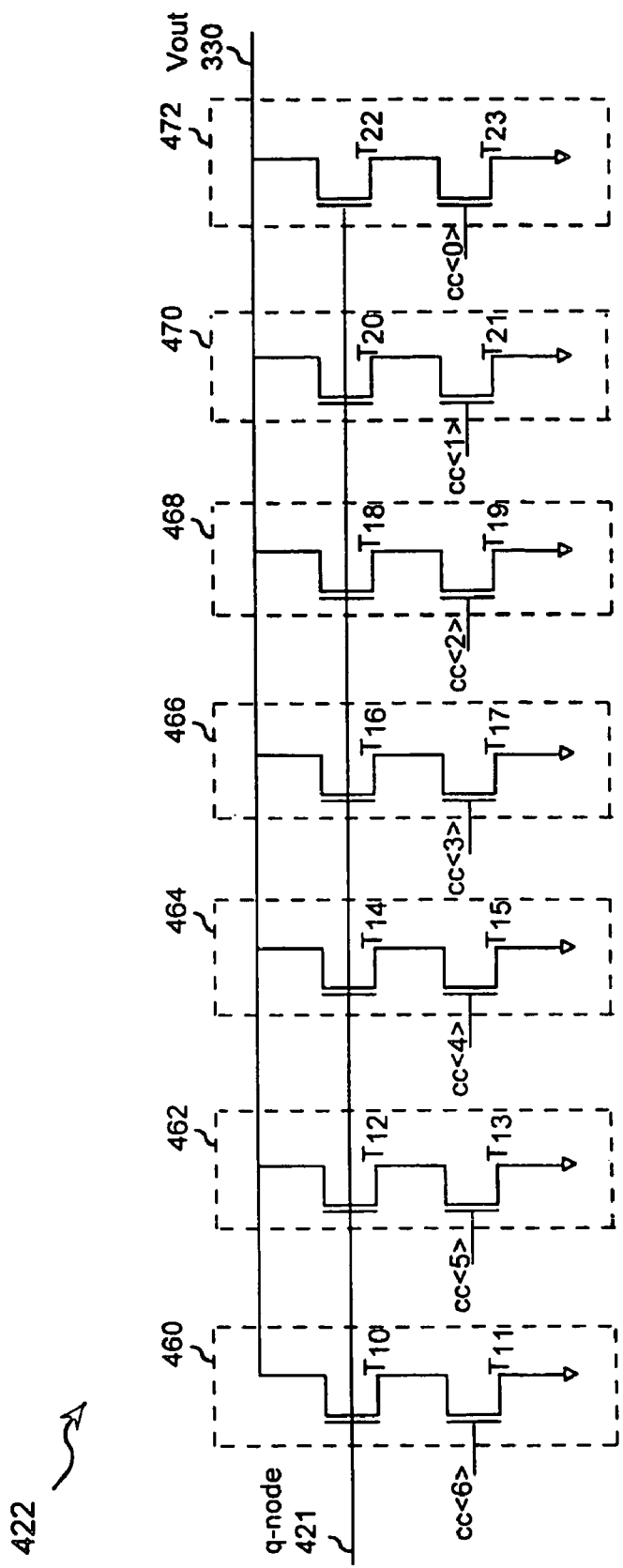
FIG. 19 illustrates schematically an embodiment of the Output Current Driver associated with the Bus Transmitter of FIG. 16.

FIG. 19 illustrates schematically Output Current Driver 422, which controls both the voltage swing at the output pins of the transmitting device and the average level of that swing in response to Current/Symmetry control bits cc. (In the interests of simplicity, FIG. 19 omits circuitry for equalizing the output signal from Output Current Driver 422.) Output Current Driver 422 includes multiple Transistor Stacks 460–472 connected in parallel between Bus 330 and ground. Each Transistor Stack 460–472 includes two n-channel transistors, an upper transistor and a lower transistor that are connected in series. The q-node signal on line 421 is input to the gate of the upper transistors $T_{10}$, $T_{12}$, $T_{14}$, $T_{16}$, $T_{18}$, $T_{20}$ and $T_{22}$. Current/symmetry control signals on a set of current/symmetry control bits, cc through cc, are input to the gate of the lower transistors $T_{11}$, $T_{13}$, $T_{15}$, $T_{17}$, $T_{21}$ and $T_{23}$. When each of the current/symmetry control signals is at or exceeds the threshold voltage ($V_{th}$) of the lower transistor, the corresponding lower transistor $T_{11}$, $T_{13}$, $T_{15}$, $T_{17}$, $T_{21}$ and $T_{23}$ is enabled or "on." When a lower transistor $T_{11}$, $T_{13}$, $T_{15}$, $T_{17}$, $T_{21}$ or $T_{23}$ is enabled and when the q-node signal transitions high (i.e., to its logic high voltage), a predetermined amount of current flows through the selected Transistor Stack to the circuit ground. Therefore, the output drive current is adjusted by setting a subset of the current/symmetry control signals to a high voltage level.

To further provide a programmable output drive current, at least one of the Transistor Stacks may be binary weighted with respect to at least one other Transistor Stacks. Preferably the transistor pairs in all the Transistor Stacks of the Output Current Driver 422 are sized so that the current drive capability of the Transistor Stacks 460, 462, 464, 466, 468, 470 and 472 have current drive ratios of 64:32:16:8:4:2:1, respectively (i.e., are binary weighted).

The Current/Symmetry Control Circuitry

Figure 20:
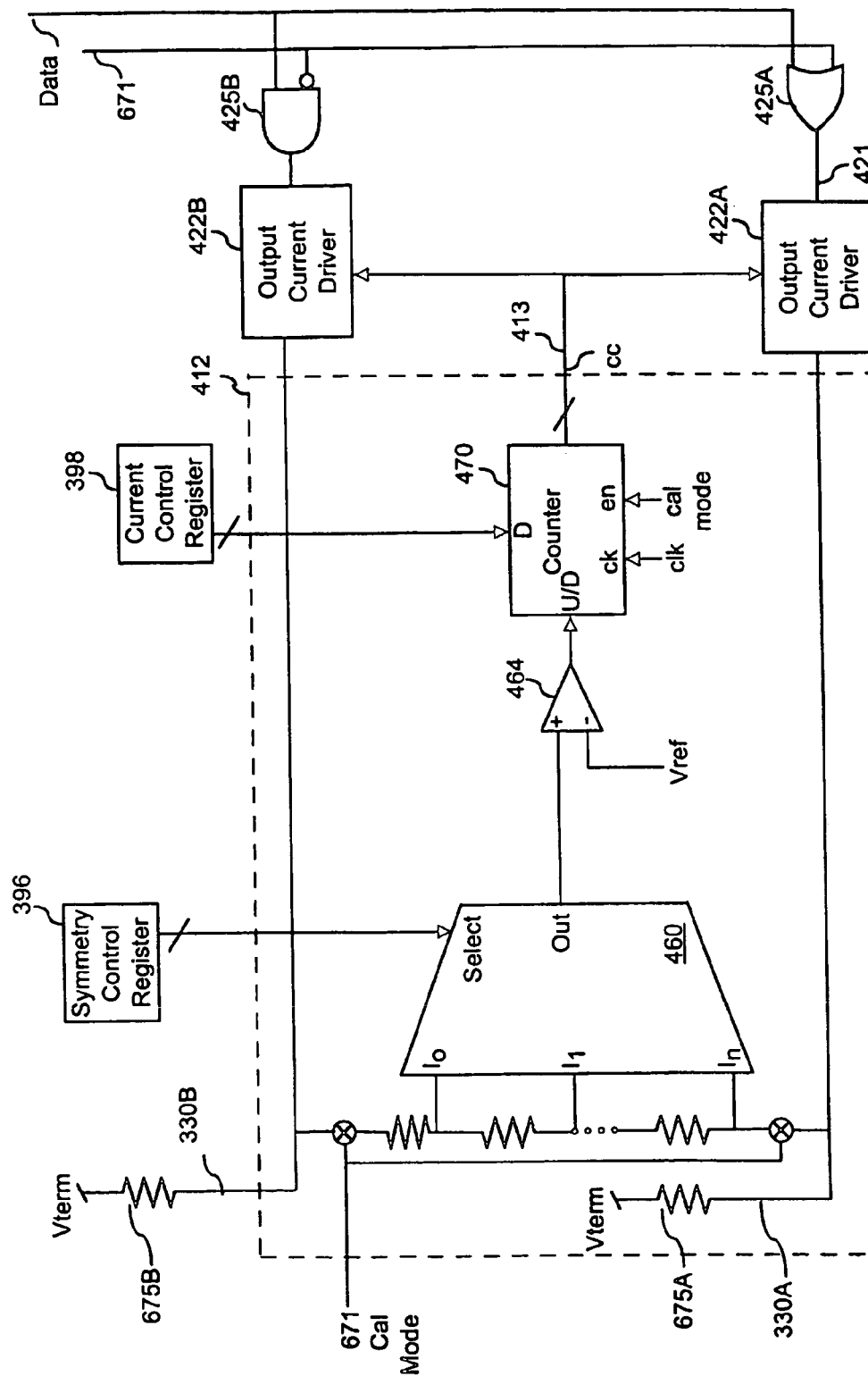
FIG. 20 illustrates schematically an embodiment of the Current/Symmetry Control Circuitry associated with the Bus Transmitter of FIG. 16.

FIG. 20 illustrates schematically Current/Symmetry Control Circuitry 412, which produces the Current/Symmetry Control bits cc. Current/Symmetry Control Circuitry 412 can be used to adjust the average level of signals output by Output Current Driver 422 via the topography dependent parameter stored in Symmetry Control Register 396 or to cause Output Current Driver 422 to produce full swing output signals via the topography dependent parameter stored in Current Control Register 398. Current/Symmetry Control Circuitry 413 includes a multiplexer·(MUX) 460, a Comparator 464, and a Counter 470, whose count is represented as the Current/Symmetry Control bits, cc, on line 413. More specifically, when Cal Mode signal on line 671 is asserted, Switches 414A and 414B close to couple Resistor Network 672 between Bus Lines 330A and 330B. Each node between the resistors of Resistor Network 672 is coupled to a respective input of MUX 460. The Cal Mode signal on line 671 also controls logic Gates 425A and 425B, which, control Output Current Drivers 422A and 422B. When turned on by Gate 425A, Output Current Driver 422A sinks current through Resistor 675A, pulling Bus Line 330A to a low potential. At approximately the same time Gate 425B turns off Output Current Driver 422B, which leaves Bus Line 330B pulled up through Resistor 675B. This arrangement produces a voltage divider between Bus Lines 330A and 330B, with successively lower voltage appearing at each input to MUX 460.

Current Control Register 398 can be used to load a value into Counter 470, thereby directly controlling the value represented by Current/Symmetry Control bits, cc. In contrast, Symmetry Control Register 396 indirectly controls the Current/Symmetry Control bits. The topography dependent parameter stored in Symmetry Control Register 396 is used to select one of the inputs to MUX 460 as its output signal. The inputs to MUX 460 are generated by a series of taps on a resistive voltage divider tied between ground and an output voltage produced by Output Current Driver 422, the $V_{out}$ signal. The signal output by MUX 460 is coupled as an input to Comparator 464. Comparator 464 compares the input signal from MUX 460 to a reference voltage, $V_{ref}$. The output signal from Comparator 464 is coupled to the Up/Down input of Counter 470. If the MUX output is greater than $V_{ref}$, Comparator 464 forces Counter 470 to increase its count, and if the Mux output is less than $V_{ref}$ then Comparator 464 forces Counter 470 to decrease its count. Comparator 464 drives its output signal up or down until the $V_{out}$ signal causes the voltage at the selected tap of the resistive divider to equal $V_{ref}$. When this occurs, the current output by Output Current Driver 422 has reached the desired level indicated by the topography dependent parameter in Symmetry Control Register 396. By setting the value of the topography dependent parameter stored in Symmetry Control Register 396 to select one of the different taps of Resistor Network 67 2, an appropriate degree of asymmetry may be produced in the output voltage swing. Thus, the topography dependent parameter stored in Symmetry Control Register 396 can be used to adjust the midpoint between a high output voltage and low output voltage up or down relative to $V_{ref}$.

The Output Current Driver and Temporal Equalization

Figure 26A:
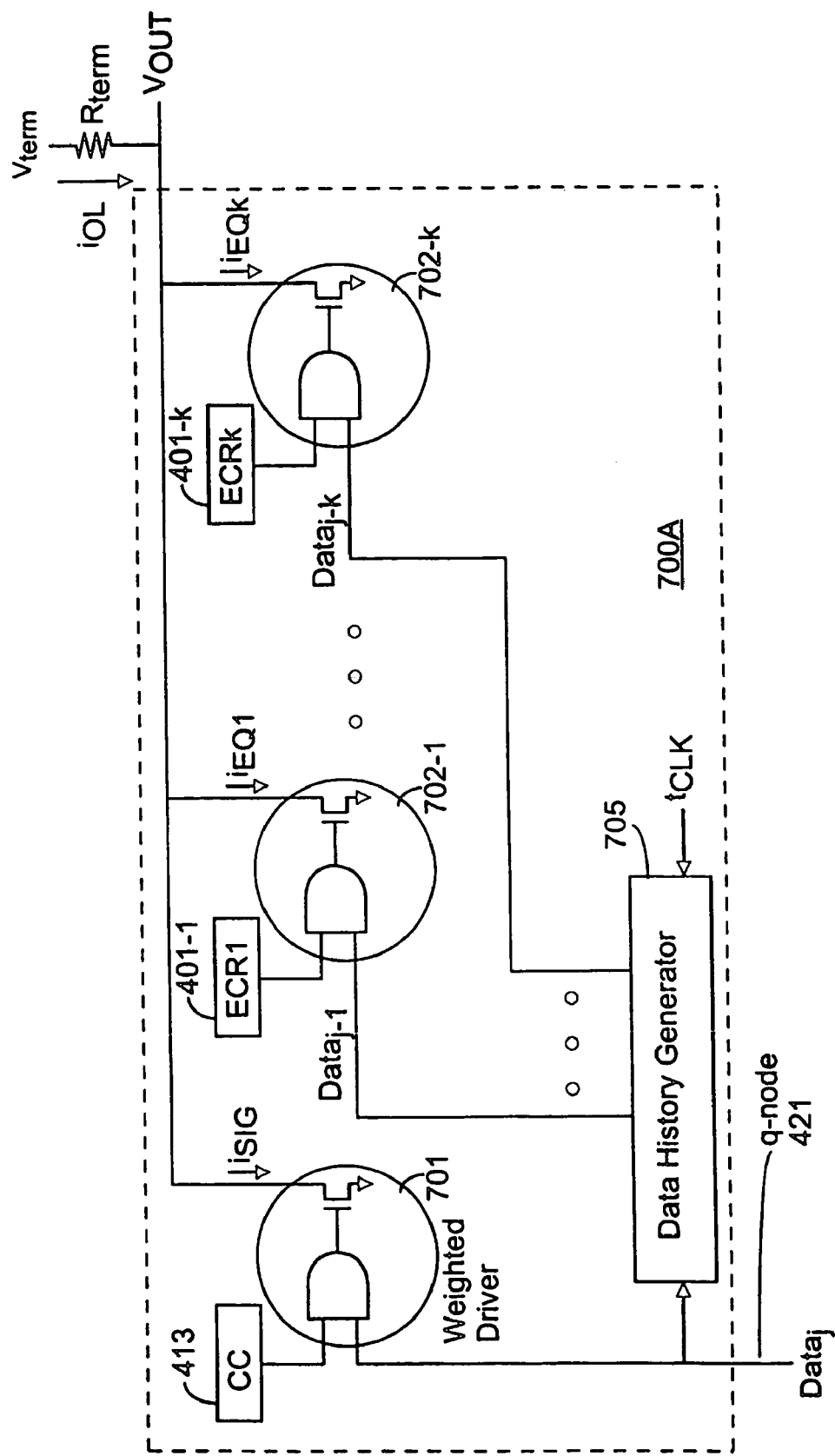
FIGS. 26A and 26B are block diagrams of an output current driver that dynamically adjusts its drive strength to compensate for residual signals on the same channel.

FIG. 26A illustrates, in block diagram form, an embodiment 700A of Output Current Driver 422 that dynamically adjusts its drive strength to compensate for voltage margins caused by residual signals on the same channel. Output Current Drive 700A adjusts its drive current in response to the topography dependent parameter stored in Equalization Control Register 401. In other words, Output Current Driver 700A performs temporal equalization in response to a topography dependent parameter. In the interests of simplicity, FIG. 26A omits circuitry related to Current/Symmetry control. To accommodate Output Current Driver 700A, Equalization Control Register 401 is preferably realized as a multiplicity of Equalization Control Registers (ECRs), ECR1 401-1 through ECRk 401-k, each storing a topography dependent equalization coefficient, $c_{eq}$. Output Current Driver 700A includes Weighted Driver 701, a multiplicity of Equalization Drivers 702-1 to 702-K, and Data History Generator 705. Weighted Driver 701, which may be implemented using the same circuitry as shown in FIG. 19, receives a data signal, $Data_j$, from q-node 421 and weights that signal by an amount determined by the current control CC parameter, as explained above. When turned on by the data signal, $Data_j$, a current $i_{SIG}$ to flow through Weighted Driver 701. In other words, the magnitude of $i_{SIG}$ is a function of $Data_j$ and CC. Data History Generator 705 provides input signals to the Equalization Drivers 702 that represent prior data signals, $Data_{j-1}$ through $Data_{j-k}$. Data History Generator 705 may be realized as a shift register. Like Weighted Driver 701, Equalization Drivers 702 weight their respective prior data signals by an amount determined by an associated ECR, which stores a topography dependent equalization coefficient, $c_{eq}$. Thus the Equalization Drivers 702 respectively sink equalization currents $i_{EQ1}$ through $i_{EQK}$, each of which is a function of the prior data signal input to the individual Equalization Driver 702 and the associated topography dependent equalization coefficient. The total current, $i_{OL}$, output by Output Current Driver 700A may be expressed as follows:

$$i_{OL}=i_{SIG}+i_{EQ1}+i_{EQ2}+i_{EQK}$$

Thus, by controlling the magnitude of $i_{OL}$ ECRs 401A–401K+1 enable equalization of $V_{OUT}$ to compensate for residual signals associated with a particular channel. That is to say, $V_{OUT}$ is directly related to $i_{OL}$.

As discussed above with respect to FIG. 19, Weighted Driver 701 includes N binary weighted Transistors 703A–703N (1x, 2x, . . . $2^{N-1}$x). Thus, the current through Weighted Driver 701, $i_{SIG}$, is given by $i_{SIG}=Data_j\times CC\times I_{UNIT}$; where $I_{UNIT}$ is the current through the smallest weighted transistor (T23, FIG. 19) in weighted driver 701 when it is active;

CC is a current control value; and $Data_j$ is the data signal input to Weighted Driver 701.

Data History Generator 705 receives the signal $Data_j$ and a transmit clock signal, $t_{CLK}$, and generates K delayed data signals, $Data_{j-1}$ through $Data_{j-k}$. In one embodiment, a new data value is transmitted at each rising edge and each falling edge of the $t_{CLK}$ signal, while in an alternative embodiment data is transmitted on only one clock edge per cycle of the transmit clock.

Figure 26B:
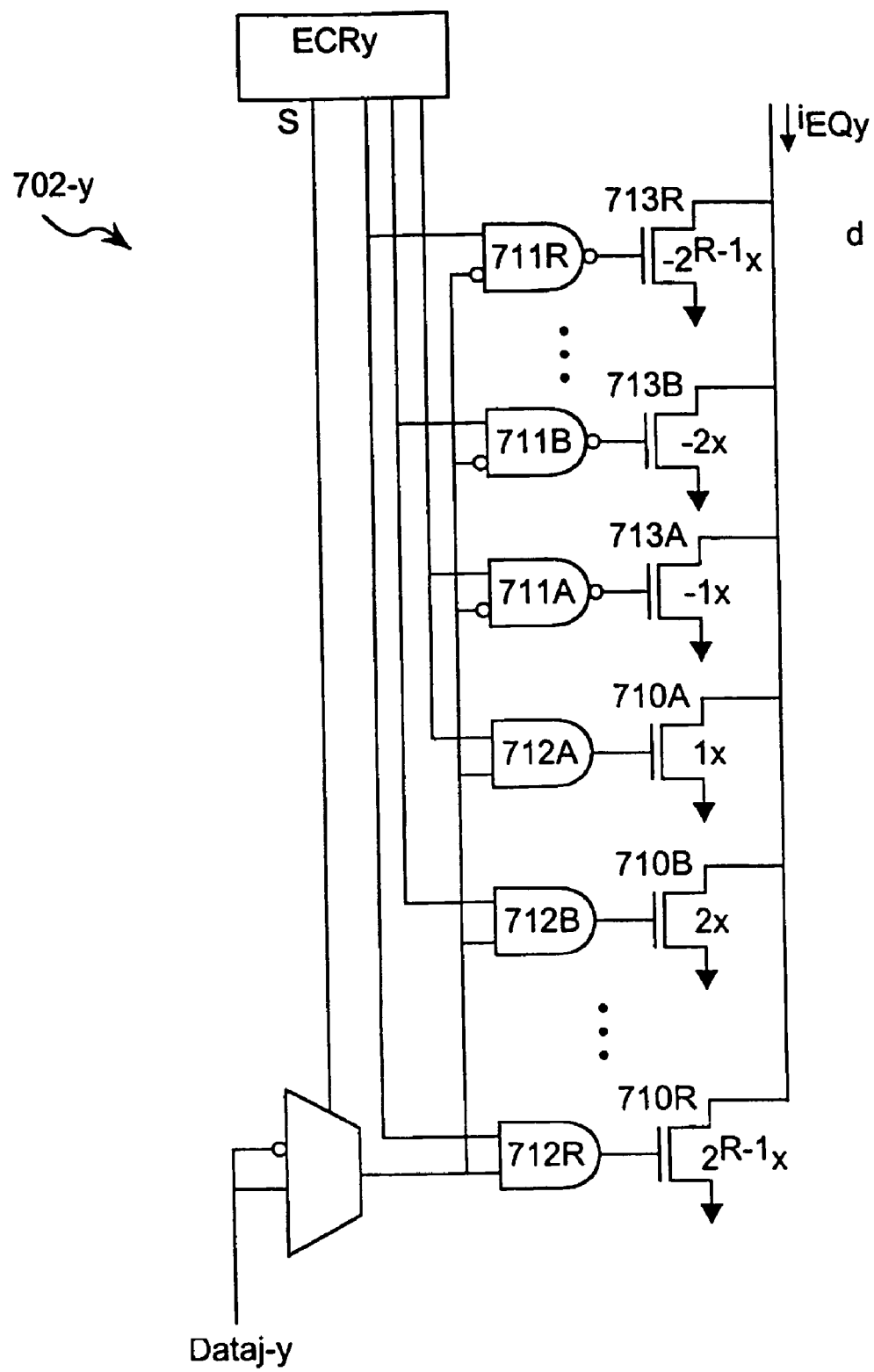

FIG. 26B illustrates in greater detail one of the Equalization Drivers 702-$y$ of FIG. 26A. Equalization Driver 702-$y$ includes a multiplexer (MUX) 709, a set of additive logic gates, ADD Gates 712A–712R, a set of associated binary weighted Transistors 710A–710R, a set of subtractive logic gates, SUB Gates 711A–711R, and a set of associated binary weighted Transistors 713A–713R. In the illustrated embodiment, each ECR 401A–401K+1 represents it equalization coefficient via a sign bit (S bit) and multiple magnitude bits. In the illustrated embodiment, the equalization coefficient is represented by three magnitude bits; however, other embodiments including fewer or more magnitude bits are consistent with the present invention. Referring specifically to the illustrated embodiment of Equalization Driver 702-$y$ in FIG. 26B, the S bit selects from MUX 709 either the inverted or non-inverted version of the $Data_{j-y}$ signal, while each bit of the coefficient magnitude is input to an "ADD" AND Gate 712 and to a "SUB" AND Gate 711. The paired ADD Gate 712 and SUB Gate 711 associated with a particular magnitude bit each are associated with a similarly weighted binary weighted Transistor. In particular, bit 1 of the coefficient magnitude is input to ADD Gate 712A and SUB Gate 711A, which, depending on the state of the $Data_{j-y}$ signal, activates Transistor 710A (1×) and Transistor 713A (−1×), respectively. Note that the binary weighting of Transistors 710A and 713A is equal in magnitude, but of opposite sign. Similarly, bit 2 of the coefficient magnitude in input to ADD Gate 712B and SUB Gate 711B, which may active Transistor 710B and Transistor 713B, respectively.

Consider the operation of Equalization Driver 702-$y$ when the coefficient magnitude bits stored in ECRy 401-$y$ represent zero. In this situation, every SUB Gate 711A–711R activates its associated binary weighted Transistor 713A–713R, while no ADD Gate 712A–712R activates its associated binary weighted Transistor 710A–710R. This is true regardless of the state of the $Data_{j-y}$ signal or the state of the S bit from ECR2 401B. Thus, the current sunk by Equalization Driver 702-$y$ $i_{EQy}$, is approximately $(2^R-1) \times I_{UNIT}$, where $I_{UNIT}$ is the current through 1x transistor 710A when it is activated.

Next, consider the operation of Equalization Driver 702-$y$ when the equalization coefficient is at a positive maximum, rather than a minimum; i.e., all coefficient bits are set and the S bit is positive. In this situation, every ADD Gate 712A–712R activates its associated binary weighted Transistor 710A–R and no SUB Gate 711A–711R actives its associated binary weighted Transistor 713A–R. Thus, the current sunk by Equalization Driver 702-1, $i_{EQ1}$, is approximately $(2^{R+1}-2) \times I_{UNIT}$. Finally, consider the operation of Equalizer Driver 702-$y$ when the equalization coefficient is at a negative maximum; i.e. all the magnitude bits are set and the S bit is negative. When this occurs all ADD Gates 712A–712R and all SUB Gates 711A–711R are turned off and none of the binary weighted Transistors 710A–710R and 713A–713R is activated. Thus, in this situation Equalizer Driver 702-$y$ sinks no current. The current sunk by Equalizer Driver 702-$y$ is generally expressed as follows:

$$i_{EQ1} = 2^R \times I_{UNIT} + (c_{EQ1} \times 2^R) \times \text{Polarity}(Data_{j-1}) \times I_{UNIT};$$

where $\text{Polarity}(Data_{j-1})$ is 1 if $Data_{j-1}=1$ and −1 if $Data_{j-1}=0$.

Equalizer Drivers 702-1 to 702-$k$ operate in a similar fashion in response to their associated data signals and equalizer coefficients, allowing their output current to be increased or decreased relative to $2^R \times I_{UNIT}$. Thus, the total current $i_{OL}$ output by Output Current Driver 700A is given by the following expression:

$$i_{OL} = i_{SIG} + i_{EQ};$$

where $$i_{EQ} = 2^R \times K \times I_{UNIT} + (c_{EQ1} \times 2) \times \text{Polarity}(Data_{j-1}) \times I_{UNIT};$$
$$\text{where } (c_{EQ2} \times 2^R) \times \text{Polarity}(Data_{j-2}) \times I_{UNIT} +$$

$$(c_{EQK} \times 2^R) \times \text{Polarity}(Data_{j-K}) \times I_{UNIT}.$$

By setting the term $(2^R \times K \times I_{UNIT})$ equal to the desired high voltage level, $V_{HI}$, on the channel, the equalization coefficients, $c_{EQ1}$–$c_{EQK}$, stored in ECRs 401A–401K can be used to effect a current swing above and below the nominal current used to produce $V_{HI}$ and above and below the nominal current used to produce the desired low voltage level, $V_{LO}$. These current swings can be used in turn to overdrive or underdrive the channel, compensating the output voltage for past output levels. Note that the current $I_{UNIT}$ drawn by the 1x Transistor (T23, FIG. 19) associated with Weighted Driver 701 may be different from the current $I_{UNIT}$ drawn by the 1x Transistor 712A associated with Equalization Driver 702-$y$.

Although FIGS. 26A and 26B illustrate a pull-down circuit for the equalizing channel voltage, a combination of pull-up and pull-down circuits may be used in an alternative embodiment. For example, a set of weighted transistors coupled between $V_{TERM}$ and the output of Output Current Driver 700 may be used to pull up the output signal in proportion to a positive equalization coefficient. Generally, any circuit for adjusting channel voltages may be used without departing from the scope of the present invention.

The Output Current Driver and Cross-Talk Equalization

The circuitry of FIGS. 26A and 26B may be modified to cross-talk equalize a channel. Cross-talk equalization involves modifying a channel voltage to compensate for cross-coupled signals from neighboring channels. Referring to FIG. 26A, for example, Data History Generator 705 may be removed and the output of neighboring channels may be coupled to the inputs of Equalization Drivers 702-1 to 702-$k$. In this way, equalization currents, $i_{EQ1}$ through $i_{EQK}$, may be generated based upon the state of neighboring channels and weighted by topography dependent parameters. As with temporal equalization, a combination of weighted pull-up and pull-down circuits or other circuits for adjusting channel voltages may be used to perform cross-talk equalization. As discussed above, a given device may include both spatial equalization circuitry and temporal equalization circuitry.

Receiver-Side Equalization

Figure 27:
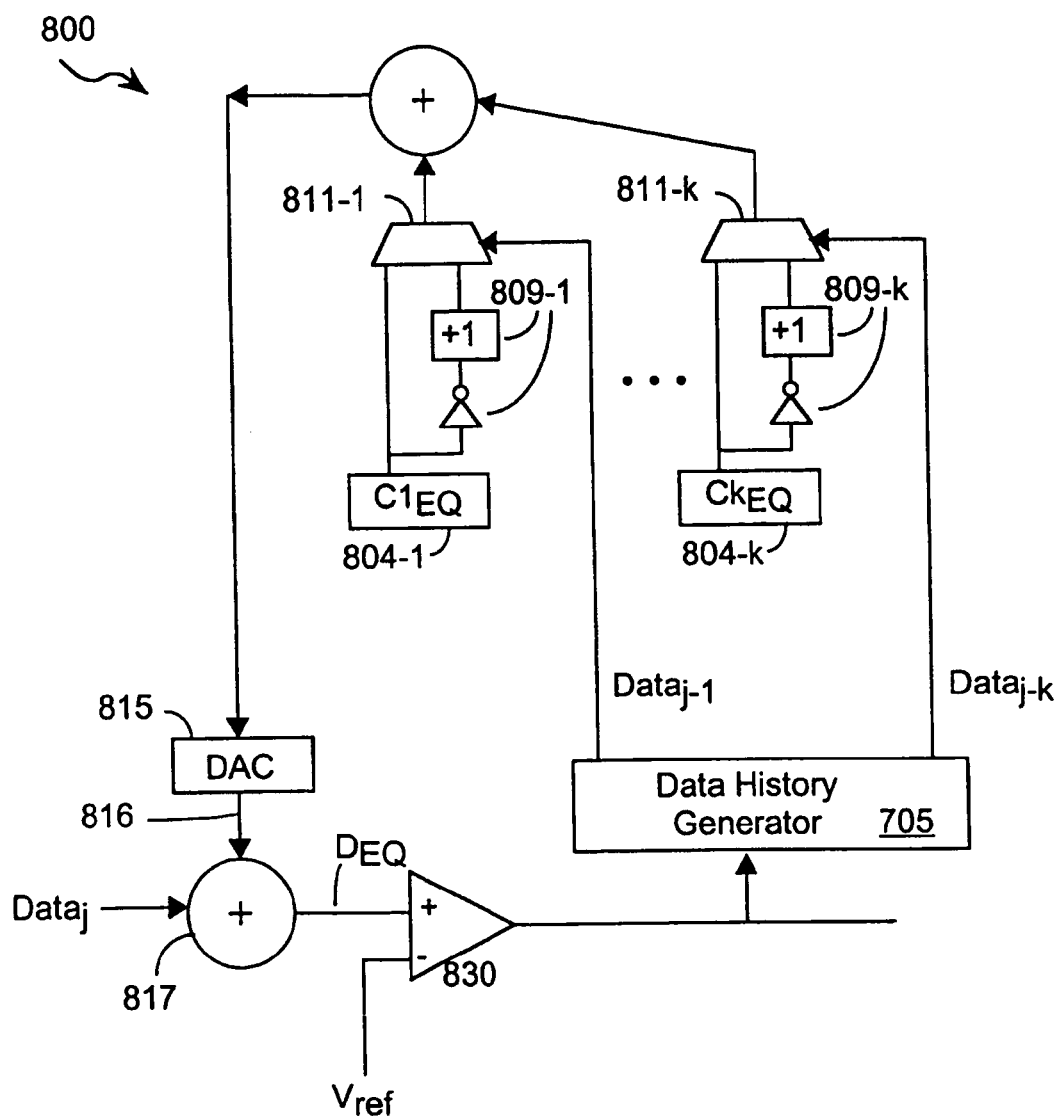
FIG. 27 is a block diagram of a bus receiver with equalization circuitry to compensate for residual signals on the same channel.

FIG. 27 illustrates a bus receiver 800 with equalization circuitry according to one embodiment. Incoming data, $Data_j$, is summed with an equalization offset 816 by analog adder 817, generating an equalized data value $D_{EQ}$, for comparison with $V_{ref}$ by a comparator 830. The equalization offset 816 is generated by adding and subtracting equalization coefficients $C1_{EQ}$ to $CK_{EQ}$ according to the state of previously received data values, $Data_{j-1}$ to $Data_{j-k}$, respectively.

A data history generator 705, preferably implemented as a shift register, receives the output of the comparator 830 and generates the data history values, $Data_{j-1}$ to $Data_{j-k}$. The data history values are used to select, via multiplexers 811-1 to 811-$k$, between positive and negative versions of respective equalization coefficients $C1_{EQ}$ to $CK_{EQ}$ stored in equalization registers 804-1 to 804-$k$. As with the equalization coefficients discussed above with reference to FIG. 26B, equalization coefficients $C1_{EQ}$ to $CK_{EQ}$ may be positive or negative values. As shown in FIG. 27, a negative version of the content of each equalization register 804 is generated by a respective two's complement generator 809. Any number of circuits for generating negative versions of equalization coefficients may be used in alternate embodiments. Also, one's complement circuitry may be used in alternate embodiments instead of two's complement circuitry.

A digital adding circuit 814 receives the output from each of the multiplexers 811-1 to 811-$k$ and generates a sum of coefficients, which it provides to a digital-to-analog converter (DAC) 815. The DAC 815 generates an analog equalization offset value 816 which is summed by analog adder 817 with the incoming data value, Data$_j$.

In an alternate embodiment, separate digital-to-analog converters are used to convert the outputs of multiplexers 811-1 to 811-$k$ to respective analog values. The analog value or values are then combined with the incoming data value, Data$_j$, by analog adder 817. In this embodiment, adding stage 814 may be omitted, reducing the amount of time required to provide a valid offset value at adder 817. In another alternate embodiment, adder 817 is used to add the equalization offset to Vref instead of to the incoming data. In that case, the equalization offset is generated with reverse polarity.

In yet another alternate embodiment of a bus receiver, analog rather than digital circuitry is used to perform equalization. Sample and hold circuitry is used to capture past data signals, Data$_{j-1}$ to Data$_{j-k}$. The amplitude of the captured signals are weighted by equalization coefficients $C1_{EQ}$ to $CK_{EQ}$ from registers 804-1 to 804-$k$, and then input to analog adder 817. Cross-talk equalization is also accomplished in this manner, except that neighboring signals are weighted by the equalization coefficients instead of prior data signals on the same signal path.

C2. The Bus Receiver

Figure 21:
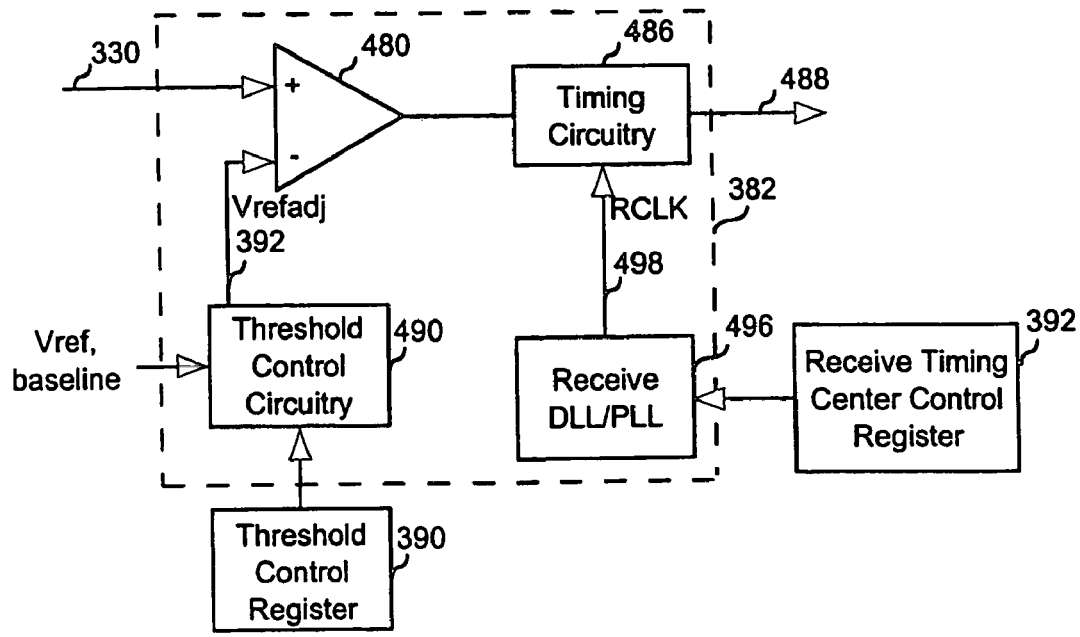
FIG. 21 is a block diagram of an embodiment of the Bus Receiver of the Slave Bus Transceiver of FIG. 15.
Figure 25:
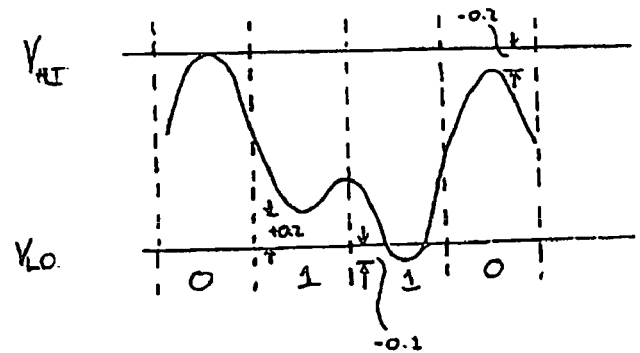
FIG. 25 illustrates the effects of residual signals on a waveform transmitted on the prior Bus.

FIG. 21 illustrates, in block diagram form, an embodiment of Bus Receiver 382 capable of adjusting any of two receive signal characteristics, Receive Timing Center and Voltage Threshold. Bus Receiver 382 includes Comparator 480 and Timing Circuitry 486. Comparator 480 compares the incoming data signals from Bus 330 with a reference voltage level, V$_{ref}$, which is adjusted by Threshold Control Circuitry 490. Threshold Control Circuitry 490 responds to a topography dependent parameter stored in Threshold Control Register 390. Threshold Control Circuitry 490 will be described in detail with respect to FIG. 22.

Timing Circuitry 486 takes the output signal from Comparator 480 and synchronizes it with the internal receive clock signal, RCLK, which is generated from CFM signal on line 332 (shown in FIG. 13). Timing Circuitry 486 outputs the synchronized receive signals to the rest of Slave 320 on line 488. Receive Delay Lock Loop/Phase Locked Loop (DLL/PLL) 496 generates the RCLK signal on line 498 and adjusts when the rising edge of the RCLK signal occurs in response to a topography dependent parameter stored in Receive Timing Center Control Register 392 so that the received data is sampled near the center of the data eye. Receive DLL/PLL will be described in detail with respect to FIG. 23.

Threshold Control Circuitry

Figure 22:
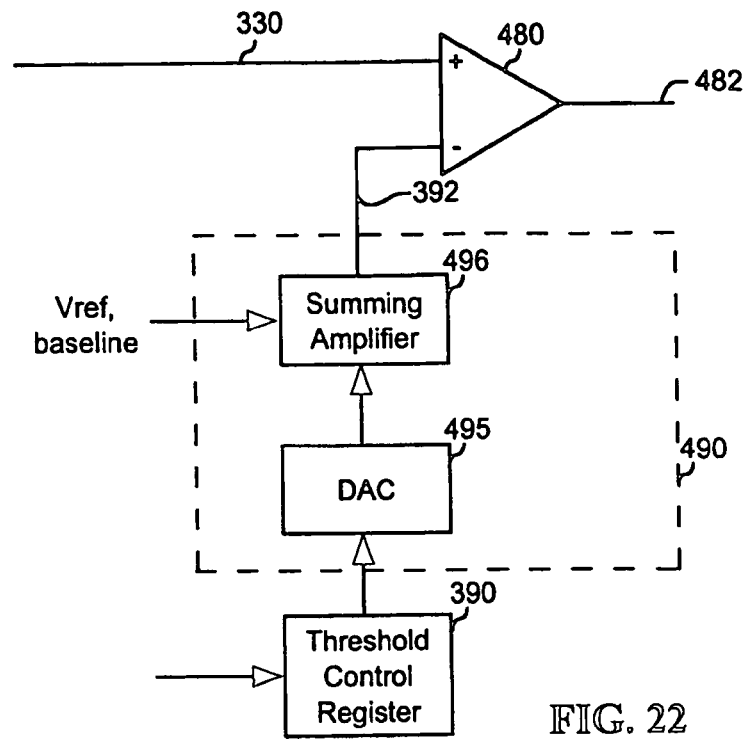
FIG. 22 is a block diagram of an embodiment of the Threshold Control Circuitry associated with the Bus Receiver of FIG. 21.

FIG. 22 illustrates, in block diagram form, Threshold Control Circuitry 490 and its relationship to Threshold Control Register 390 and Comparator 480. Threshold Control Circuitry 490 modifies the level of V$_{ref}$ from a baseline level in response to the topography dependent parameter stored in Threshold Control Register 390. The output of Threshold Control Circuitry 490 is an adjusted reference voltage, V$_{refAdj}$, on line 392 which is coupled to an input of Comparator 480. Threshold Control Circuitry 490 includes a Digital-to-Analog Converter (DAC) 494 and a Summing Amplifier 496. DAC 494 produces an analog voltage in response to the digital represented topography dependent parameter stored in Threshold Control Register 390. DAC 494 couples this analog voltage to Summing Amplifier 496 on line 495. Summing Amplifier 496 sums the voltage on line 495 with the system wide reference voltage level, V$_{ref}$, to produce V$_{refAdj}$, which is coupled to Comparator 480 on line 392.

The Receive DLL/PLL

Figure 23:
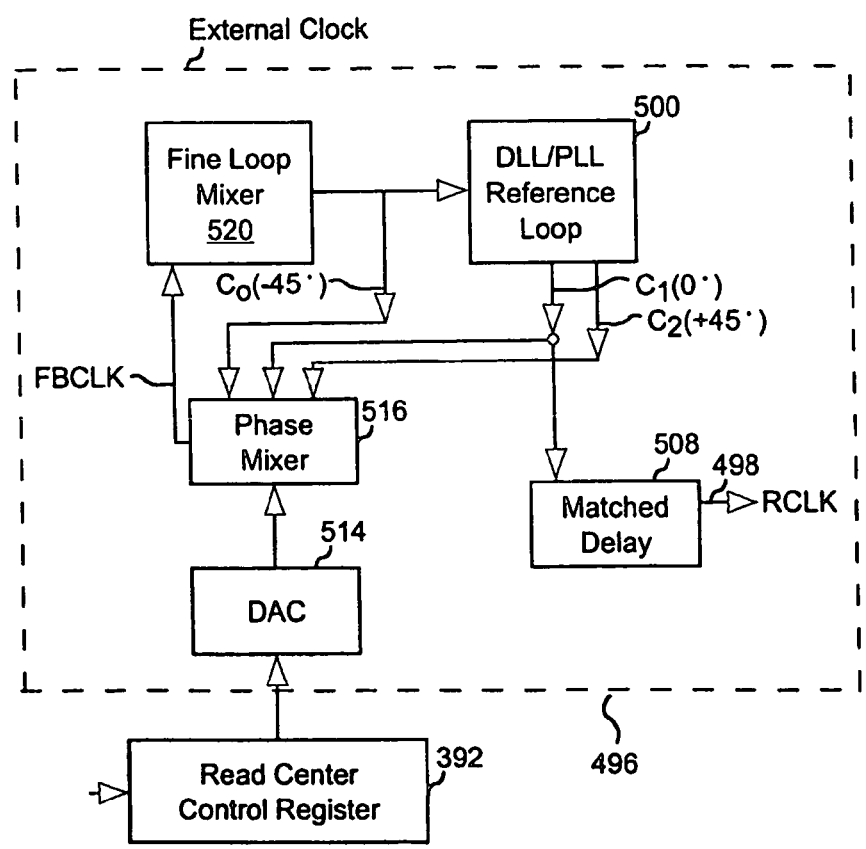
FIG. 23 is a block diagram of an embodiment of the Receive DLL/PLL of the Bus Receiver of FIG. 21.

FIG. 23 illustrates, in block diagram form, an embodiment of Receive DLL/PLL 496 that takes full advantage of signals typically available in conventional DLL/PLL circuits. Receive DLL/PLL 496 may be embodied using other Delay Lock Loop/Phase Lock Loop architectures consistent with the present invention. In the illustrated embodiment Receive DLL/PLL 496 includes DLL/PLL Reference Loop 500, Matched Delay 508, Digital-to-Analog Converter (DAC) 514, Phase Mixer 516 and Fine Loop Mixer 520. DLL/PLL Reference Loop 500 receives as input a reference clock signal, C$_0$, from Fine Loop Mixer 520. Reference clock signal C$_0$ is a 45° earlier version of the RCLK signal. Given this input, DLL/PLL Reference Loop 500 generates two additional clock signals, C$_1$ and C$_2$. The C$_1$ clock signal is offset by 45° from the C$_0$ signal, and is thus in phase with RCLK, while the C$_2$ signal is offset by 90° from the C$_0$ signal. All three clock signals, C$_0$, C$_1$ and C$_2$, are coupled to Phase Mixer 516, which generates an offset feedback signal, FBCLK, which varies between −45° to 45° offset from RCLK. The amount of offset of the FBCLK signal is determined by the topography dependent parameter stored in Receive Timing Center Control Register 392. DAC 514 produces an analog voltage representative of the desired timing offset in response to the output from Receive Timing Center Control Register 392. DAC 514 couples its output voltage to Phase Mixer 516. The C$_1$ clock signal is output through Matched Delay 508 as the RCLK signal.

D. The Master Bus Transceiver

Figure 24:
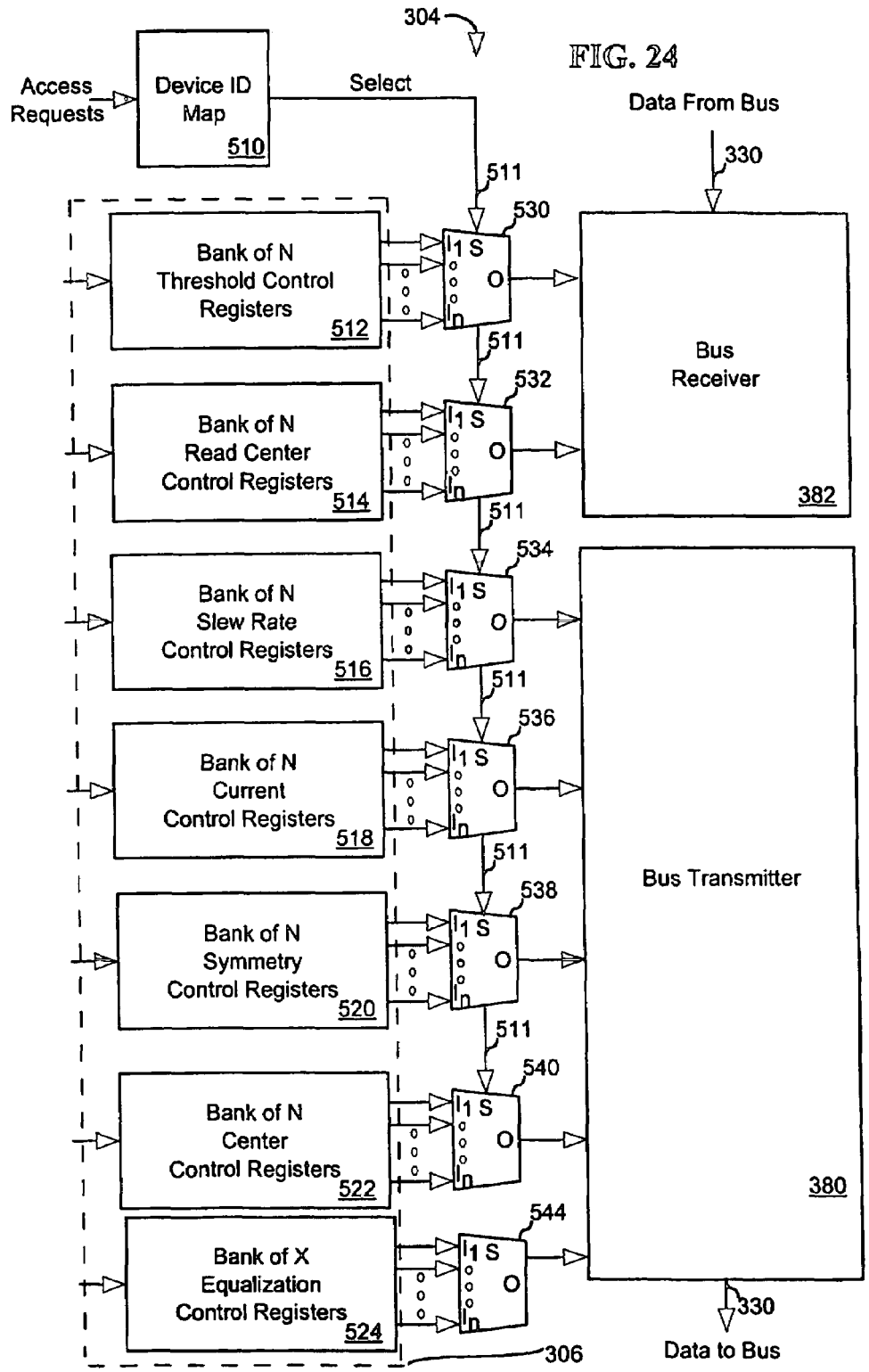
FIG. 24 is a block diagram of an embodiment of the Master Bus Transceiver of the present invention.

FIG. 24 illustrates, in block diagram form, Master Bus Transceiver 304 capable of adjusting any of several receive and transmit signal characteristics for each Slave 320 according to the topography of the Slave 320. Master Bus Transceiver 304 includes Control Registers 306, Bus Receiver 382, Bus Transmitter 380, Multiplexers (MUXs) 530–540 and Device ID Map 510. Map 510 selects one of N control registers in each of several banks of control registers 512–522 based on an address or other identifier in each access request.

Control Registers 306 include several Banks of control registers 512–522, one bank of control registers for each signal characteristic to be adjusted in response to a topography dependent parameter. Each bank of control registers 512–522 includes N control registers, where N may represent the number of Slaves 320 in Bus System 300, the number of Modules 340, or any other number of grouping of Slaves 320 or Modules 340 which are to be assigned the same values for topography dependent parameters. Thus, Bank 512 includes N Threshold Control Registers, each storing a topography dependent parameter for a subset of Slaves 320 or Modules 340. Each Threshold Control Register stores the same type of topography dependent parameter discussed previously with respect to Threshold Control Register 390. Bank 514 includes N Receive Timing Center Control Registers, each storing the same type of topography dependent parameter discussed previously with respect to Receive Timing Center Control Register 392. Bank 516 includes N Slew Rate Control Registers, each storing for a particular subset of Slaves 320 or Modules 340 the same type of topography dependent parameter previously discussed with respect to Slew Rate Control Register 394. Bank 518 includes N Current Control Registers, each storing the same type of topography dependent parameter previously discussed with respect to Current Control Register 396. N Symmetry Control Registers comprise Bank 520, each storing the same type of topography dependent parameter discussed previously with respect to Symmetry Control Register 398. Similarly, Bank 522 comprises N Transmit Timing Center Control Registers, each storing the same type of topography dependent parameter previously discussed with respect to Transmit Timing Center Control Register 400. Bank 524 comprises X Equalization Control Registers, each storing the same topography dependent equalization coefficients discussed previously with respect to Equalization Control Register 401.

In alternate embodiments of Control Registers 326 may includes one of each type of control register bank per channel of Bus 330. These embodiments contrast with the illustrated embodiment, which includes one bank of each type of control register.

Associated with each Bank of Control Registers 512–552 is a MUX 530, 532, 534, 536, 538 or 540 for selecting the topography dependent parameter associated with a single control register of the Bank. The selected topography dependent parameter from the Bank is then coupled to either Bus Receiver 382 or Bus Transmitter 380. For example, MUX 530 couples the topography dependent parameter from a single Threshold Control Register of Bank 512 to Bus Receiver 382 while MUX 538 couples the topography dependent parameter from a single Symmetry Control Register of Bank 520 to Bus Transmitter 380. Each MUX 530–540 selects which input signal is to be output in response to a Device ID signal on line 511 generated by Device ID Map 510. Device ID Map 510 analyzes the memory requests received by Master 302 and identifies the particular Slave 320 to whom data should be exchanged. Device ID Map 510 indicates the identified Slave 320 via its Device ID signal. Device ID Map 510 may be realized as a memory device storing a table mapping system addresses to device IDs.

Bus Receiver 382 has been previously described with respect to FIGS. 21–23 and Bus Transmitter 380 has been previously described with respect to FIGS. 16–20.

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An integrated circuit device comprising:
    a transmitter circuit including an output driver to output data; and
    a register to store a value representative of an equalization co-efficient setting of the output driver, wherein the value is determined based on information stored in a supplemental memory device.

2. The integrated circuit device of claim 1, wherein the value is determined by accessing the supplemental memory device.

3. The integrated circuit device of claim 2, wherein the supplemental memory device is a serial presence detect memory device.

4. The integrated circuit device of claim 2, wherein the output driver outputs the data to a memory device disposed on a memory module, wherein a serial presence detect memory device is associated with the memory module.

5. The integrated circuit device of claim 1, wherein the equalization co-efficient setting compensates for a cross coupled signal present on an external signal line.

6. The integrated circuit device of claim 1, wherein the data is output onto an external signal line, wherein the equalization co-efficient setting compensates for residual signals present on the external signal line.

7. The integrated circuit device of claim 1, further including a data history generator circuit coupled to the transmitter circuit, to adjust the transmitter circuit based on previous data output by the output driver.

8. The integrated circuit device of claim 1, wherein the memory device includes a locked loop circuit to generate an internal clock signal, wherein:
    the output driver outputs a first data value of the data at a rising edge transition of the internal clock signal; and
    the output driver outputs a second data value of the data at a falling edge transition of the internal clock signal.

9. The integrated circuit device of claim 1, wherein the output driver outputs the data to a memory device disposed on a memory module, and wherein a serial presence detect memory device is associated with the memory module.

10. The integrated circuit device of claim 1, further comprising:
    a locked loop circuit to generate an internal transmit signal, wherein the transmitter circuit outputs the data in response to the internal transmit signal;
    a register to store a value representative of a transmit timing offset to apply to the internal transmit signal; and
    a register to store a value representative of a slew rate adjustment that is applied to the transmitter circuit.

11. A method of operation in a system, wherein the system includes a first integrated circuit device coupled to a second integrated circuit device, the method comprising:
    upon initialization of the system:
        deriving a value, representative of an equalization setting of an output driver disposed on the first integrated circuit device, based on information pertaining to the second integrated circuit device; and
        programming the value into a register disposed on the first integrated circuit device.

12. The method of claim 11, further comprising:
    generating an internal transmit signal using a locked loop circuit;
    outputting a first data value of data at a rising edge transition of the internal transmit signal; and
    outputting a second data value of the data at a falling edge transition of the internal transmit signal.

13. The method of claim 11, further including accessing the information from a supplemental memory device.

14. The method of claim 13, wherein the supplemental memory device is a serial presence detect memory device.

15. The method of claim 14, wherein the serial presence detect memory device is associated with a memory module and wherein the second integrated circuit device controls the operation of the first integrated circuit device.

16. The method of claim 15, wherein the first integrated circuit device is a memory device disposed on the memory module.

17. The method of claim 11, wherein the first and second integrated circuit devices are included in a plurality of memory devices disposed on a memory module and the information pertaining to the second integrated circuit device is based on configuration information of the plurality of memory devices.

18. The method of claim 11, wherein deriving the value includes performing a look-up based on the information using a table.

19. The memory device of claim 11, further including outputting data onto an external signal line using a predetermined drive strength setting, wherein the drive strength setting of the output driver includes the equalization setting to compensate for a residual signal present on the external signal line.

20. The method of claim 19, wherein the residual signal includes a cross-coupled signal present on the external signal line.

21. An integrated circuit device comprising:
    a transmitter circuit including an output driver to output data;
    a first register to store a value representative of a drive strength setting associated with the transmitter circuit such that the output driver outputs the data in accordance with the drive strength setting; and
    a second register to store a value representative of an equalization setting associated with the transmitter circuit such that the output driver outputs the data in accordance with the equalization setting.

22. The integrated circuit device of claim 21, wherein the data is output onto an external signal line, wherein the equalization setting compensates for a cross-coupled signal present on the external signal line.

23. The integrated circuit device of claim 21, further including a data history generator circuit coupled to the transmitter circuit, to provide an adjustment to the drive strength setting based on data that was previously output by the output driver.

24. The integrated circuit device of claim 23, wherein the data history generator includes a shift register to store the data that was previously output by the output driver, wherein a voltage swing setting of the output driver is modified based on the data that was previously output by the output driver.

25. The integrated circuit device of claim 21, wherein the integrated circuit device is a memory device.

26. The integrated circuit device of claim 21, wherein the integrated circuit device includes a locked loop circuit to generate a transmit clock signal, wherein the data is output using the transmit clock signal.

27. The integrated circuit device of claim 26, further including a register to store a value representative of a transmit time adjustment that is applied to the transmit clock signal.

28. The integrated circuit device of claim 21, wherein the drive strength setting of the output driver indicates a voltage swing of the data that is output.

29. The integrated circuit of claim 21, further including a counter, coupled to the output driver, to hold a count value that is used to adjust the voltage swing of the output driver in accordance with a signal that indicates a direction to adjust the count value.

30. An integrated circuit memory device disposed on a memory module along with a plurality of integrated circuit memory devices, the integrated circuit memory device comprising:
    a transmitter circuit including a output driver to output data synchronously with respect to an external clock signal; and
    a register to store a value representative of an equalization setting of the output driver, wherein the value is determined based on information stored in a first memory device of the plurality of integrated circuit memory devices.

31. The integrated circuit memory device of claim 30, wherein the integrated circuit memory device includes a locked loop circuit to generate a transmit clock signal, wherein the data is output onto the external signal line using the transmit clock signal.

32. The integrated circuit memory device of claim 30, wherein the value is derived from a look-up table.

33. The integrated circuit memory device of claim 30, wherein the plurality of integrated circuit memory devices includes dynamic random access memory devices and a serial presence detect memory device, wherein the serial presence detect memory device is the first memory device that stores the information.

* * * * *